(12) United States Patent
Shang et al.

(10) Patent No.: US 12,399,287 B2
(45) Date of Patent: Aug. 26, 2025

(54) DETECTION SUBSTRATE, MANUFACTURING METHOD THEREFOR AND FLAT PANEL DETECTOR

(71) Applicants: Beijing BOE Sensor Technology Co., Ltd., Beijing (CN); BOE Technology Group Co., Ltd., Beijing (CN)

(72) Inventors: Jianxing Shang, Beijing (CN); Liyou Xiao, Beijing (CN); Jianhe Li, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/247,846

(22) PCT Filed: Apr. 29, 2022

(86) PCT No.: PCT/CN2022/090128
§ 371 (c)(1),
(2) Date: Apr. 4, 2023

(87) PCT Pub. No.: WO2023/206316
PCT Pub. Date: Nov. 2, 2023

(65) Prior Publication Data
US 2024/0369722 A1   Nov. 7, 2024

(51) Int. Cl.
*G01T 1/20* (2006.01)
*H10F 39/00* (2025.01)
*H10F 39/18* (2025.01)

(52) U.S. Cl.
CPC .......... *G01T 1/2018* (2013.01); *H10F 39/011* (2025.01); *H10F 39/1898* (2025.01)

(58) Field of Classification Search
CPC ..... G01T 1/2018; G01T 1/20189; G01T 1/20; G01T 1/202; H10F 39/011;
(Continued)

(56) References Cited

U.S. PATENT DOCUMENTS

| 6,965,409 B1 | 11/2005 | Hamamoto |
| 2008/0116381 A1* | 5/2008 | Kondo ..................... G21K 4/00 250/361 R |

(Continued)

FOREIGN PATENT DOCUMENTS

| CN | 102779565 A | 11/2012 |
| CN | 103646680 A | 3/2014 |

(Continued)

OTHER PUBLICATIONS

"Standard Specification for Oriented Polypropylene Film," Mar. 18, 2022, American Society of Testing Materials International (Year: 2022).*

*Primary Examiner* — Edwin C Gunberg
*Assistant Examiner* — Richard O Toohey
(74) *Attorney, Agent, or Firm* — Workman Nydegger

(57) ABSTRACT

Provided are a detection substrate, a manufacturing method therefor and a flat panel detector. The detection substrate includes: a flexible substrate; a scintillator layer on a side of the flexible substrate, where the scintillator layer includes a central portion and a peripheral portion on at least one side of the central portion, the central portion and the peripheral portion are of an integrated structure, a thickness of the central portion at each position is approximately equal, and in a direction from an edge of the flexible substrate to a center of the flexible substrate, a thickness of the peripheral portion progressively increases; and a reinforcement structure, the reinforcement structure and the scintillator layer being on the same side of the flexible substrate, and the reinforcement structure at least covering part of the peripheral portion.

15 Claims, 16 Drawing Sheets

(58) Field of Classification Search
CPC .............. H10F 39/1898; H10D 30/611; H10D 62/8603; H10D 64/605; H10D 30/0289; H10H 20/816

See application file for complete search history.

(56) References Cited

U.S. PATENT DOCUMENTS

| | | |
|---|---|---|
| 2012/0288688 A1 | 11/2012 | Kug et al. |
| 2013/0048864 A1* | 2/2013 | Nakatsugawa ..... G01T 1/20187 |
| | | 156/60 |
| 2017/0329023 A1 | 11/2017 | Homma et al. |
| 2020/0003911 A1* | 1/2020 | Nara ................. H01L 27/14663 |
| 2021/0003515 A1 | 1/2021 | Ushikura et al. |
| 2021/0333421 A1 | 10/2021 | Ushikura et al. |
| 2021/0407340 A1* | 12/2021 | Wang ..................... G09F 9/301 |

FOREIGN PATENT DOCUMENTS

| | | | | |
|---|---|---|---|---|
| CN | 103744103 A | | 4/2014 | |
| CN | 106662658 A | | 5/2017 | |
| CN | 110286398 | * | 9/2019 | ........... G01T 1/2023 |
| CN | 110286398 A | | 9/2019 | |
| CN | 108878666 B | | 5/2020 | |
| CN | 113167914 A | | 7/2021 | |

\* cited by examiner

Forming a scintillator layer on a side of a flexible substrate, the scintillator layer including a central portion and a peripheral portion located on at least one side of the central portion, the central portion and the peripheral portion being of an integrated structure, the central portion having an approximately uniform thickness at each position, and in a direction from an edge of the flexible substrate to a center of the flexible substrate, a thickness of the peripheral portion progressively increases — S1901

Forming a reinforcement structure on a side of the flexible substrate, the reinforcement structure and the scintillator layer being disposed on the same side of the flexible substrate, and the reinforcement structure at least covering part of the peripheral portion — S1902

FIG. 19

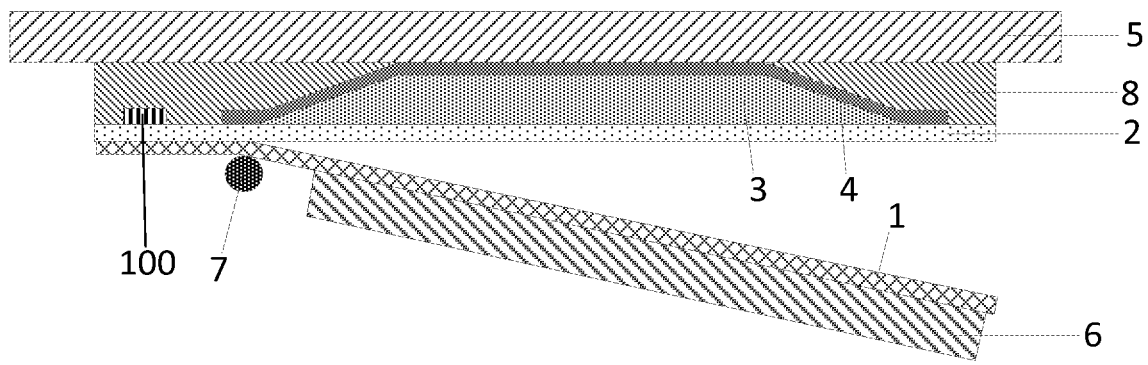

FIG. 20

Forming a scintillator film on a side of a flexible substrate, the scintillator film including a central portion and a peripheral portion located around the central portion, the central portion and the peripheral portion being of an integrated structure, the central portion having an approximately uniform thickness at each position, and in a direction from an edge of the flexible substrate to a center of the flexible substrate, a thickness of the peripheral portion progressively increases — S2601 obtaining a scintillator layer having an approximately equal thickness at each position by removing the peripheral portion completely — S2602

FIG. 26

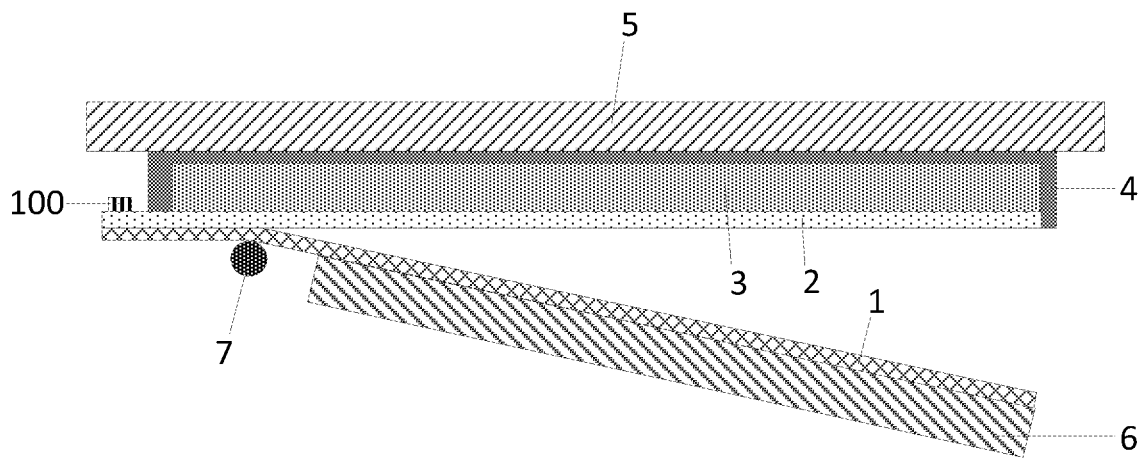

FIG. 27

DETECTION SUBSTRATE, MANUFACTURING METHOD THEREFOR AND FLAT PANEL DETECTOR

CROSS REFERENCE TO RELATED APPLICATIONS

This application is a national phase entry under 35 U.S.C. § 371 of International Application No. PCT/CN2022/090128, filed on Apr. 29, 2022, the entire content of which is incorporated herein by reference.

FIELD

The disclosure relates to the field of photoelectric detection technology, and in particular to a detection substrate, a manufacturing method therefor and a flat panel detector.

BACKGROUND

An X-ray detection has been widely used in the fields of industrial non-destructive testing, container scanning, circuit board detection, medical treatment, security, industry, etc., with broad application prospects. A traditional X-ray imaging technology is a type of analog signal imaging with low resolution and inferior image quality. An X-ray digital imaging technology can directly convert an X-image into a digital image by an X-ray flat panel detector, and has been widely developed and used since the obtained digital image is high in sharpness and resolution and easy to save and transmit.

The X-ray flat panel detector generally includes a thin film transistor (TFT) and a photodiode. Under X-ray irradiation, a scintillator layer or a phosphor layer of an indirect conversion type X-ray flat panel detector converts X-ray photons into visible light, then the visible light is converted into an electrical signal by the photodiode, and finally the electrical signal is read and output by the TFT. The electrical signal is converted into a digital signal after analog/digital (A/D) conversion, and then a computer performs image processing on the digital signal, so as to form an X-ray digital image.

SUMMARY

Embodiments of the disclosure provide a detection substrate, a manufacturing method therefor and a flat panel detector. Specific solutions are as follows.

Embodiments of the disclosure provide a detection substrate. The detection substrate includes: a flexible substrate, a scintillator layer on a side of the flexible substrate, and a reinforcement structure. The scintillator layer includes a central portion and a peripheral portion located on at least one side of the central portion, the central portion and the peripheral portion are of an integrated structure, a thickness of the central portion at each position is approximately equal, and in a direction from an edge of the flexible substrate to a center of the flexible substrate, a thickness of the peripheral portion progressively increases. The reinforcement structure and the scintillator layer are disposed on the same side of the flexible substrate, and the reinforcement structure at least covers part of the peripheral portion.

In some embodiments, in the above detection substrate provided in embodiments of the disclosure, a maximum thickness of the reinforcement structure is less than or equal to the thickness of the central portion and greater than or equal to 50% of the thickness of the central portion.

In some embodiments, in the above detection substrate provided in embodiments of the disclosure, a maximum thickness of the reinforcement structure is approximately equal to the thickness of the central portion.

In some embodiments, in the above detection substrate provided in embodiments of the disclosure, a preset distance is provided between an edge of an orthographic projection of the peripheral portion on the flexible substrate close to an edge of the flexible substrate and the edge of the flexible substrate, and the reinforcement structure further covers at least part of an area of the flexible substrate that is not covered with the peripheral portion.

In some embodiments, in the above detection substrate provided in embodiments of the disclosure, the flexible substrate includes a photosensitive area and a peripheral area around the photosensitive area, the central portion is located in the photosensitive area, the peripheral portion is located in the peripheral area, and the peripheral portion is arranged around the central portion.

In some embodiments, in the above detection substrate provided in embodiments of the disclosure, the flexible substrate includes a photosensitive area and a peripheral area around the photosensitive area, the central portion is located in the photosensitive area, the peripheral portion is at least partially located in the photosensitive area, and the peripheral portion is arranged around the central portion.

In some embodiments, in the above detection substrate provided in embodiments of the disclosure, the flexible substrate includes a photosensitive area and a peripheral area around the photosensitive area, the peripheral area includes a bonding area and a non-bonding area, and the peripheral portion is arranged on the side of the bonding area.

In some embodiments, in the above detection substrate provided in embodiments of the disclosure, the reinforcement structure is an integrated structure.

In some embodiments, in the above detection substrate provided in embodiments of the disclosure, a material of the reinforcement structure being the integrated structure includes a tape adhesive or an ultraviolet (UV) adhesive.

In some embodiments, in the above detection substrate provided in embodiments of the disclosure, the reinforcement structure includes: a first reinforcement structure at a side of the peripheral portion away from the central portion, and a second reinforcement structure between the first reinforcement structure and the peripheral portion. The first reinforcement structure makes contact with the second reinforcement structure.

In some embodiments, in the above detection substrate provided in embodiments of the disclosure, a material of the first reinforcement structure includes a tape adhesive, and a material of the second reinforcement structure includes a UV adhesive.

In some embodiments, in the above detection substrate provided in embodiments of the disclosure, the detection substrate further includes an encapsulation layer between the scintillator layer and the reinforcement structure, where the encapsulation layer completely covers the scintillator layer, an edge portion of the encapsulation layer makes contact with the flexible substrate, and the encapsulation layer is configured according to a shape of the scintillator layer. In some embodiments, in the above detection substrate provided in embodiments of the disclosure the detection substrate further includes a support layer on a side of the flexible substrate facing away from the scintillator layer.

In some embodiments, in the above detection substrate provided in embodiments of the disclosure, the detection substrate further includes: a transistor between the flexible substrate and the scintillator layer, a photoelectric conversion device between the transistor and the scintillator layer, and a bias voltage line between the photoelectric conversion device and the scintillator layer. A bottom electrode of the photoelectric conversion device is electrically connected with the transistor, and the bias voltage line is electrically connected with a top electrode of the photoelectric conversion device.

Embodiments of the disclosure provide a detection substrate. The detection substrate includes: a flexible substrate, and a scintillator layer on a side of the flexible substrate, the scintillator layer having an approximately equal thickness at each position.

In some embodiments, in the above detection substrate provided in embodiments of the disclosure, the detection substrate further includes an encapsulation layer on a side of the scintillator layer facing away from the flexible substrate. The encapsulation layer completely covers the scintillator layer, an edge portion of the encapsulation layer makes contact with the flexible substrate, and the encapsulation layer is configured according to a shape of the scintillator layer.

In some embodiments, in the above detection substrate provided in embodiments of the disclosure, the detection substrate further includes a support layer on a side of the flexible substrate facing away from the scintillator layer.

In some embodiments, in the above detection substrate provided in embodiments of the disclosure, the detection substrate further includes: a transistor between the flexible substrate and the scintillator layer, a photoelectric conversion device between the transistor and the scintillator layer, and a bias voltage line between the photoelectric conversion device and the scintillator layer. A bottom electrode of the photoelectric conversion device is electrically connected with the transistor, and the bias voltage line is electrically connected with a top electrode of the photoelectric conversion device.

Embodiments of the disclosure provide a detection substrate. The detection substrate includes: a flexible substrate, a scintillator layer on a side of the flexible substrate, and a support layer located on a side of the flexible substrate facing away from the scintillator layer. The scintillator layer includes a central portion and a peripheral portion located around the central portion, the central portion and the peripheral portion are of an integrated structure, a thickness of the central portion at each position is approximately equal, and in a direction from an edge of the flexible substrate to a center of the flexible substrate, a thickness of the peripheral portion progressively increases. When a base platform of an attaching apparatus is used for attaching the support layer on the side of the flexible substrate facing away from the scintillator layer, the scintillator layer is configured to be embedded into a concave structure of the base platform, where the concave structure is configured according to a shape of the scintillator layer.

In some embodiments, in the above detection substrate provided in embodiments of the disclosure the detection substrate further includes an encapsulation layer on a side of the scintillator layer facing away from the flexible substrate. The encapsulation layer completely covers the scintillator layer, an edge portion of the encapsulation layer makes contact with the flexible substrate, and the encapsulation layer is configured according to a shape of the scintillator layer.

In some embodiments, in the above detection substrate provided in embodiments of the disclosure, the detection substrate further includes: a transistor between the flexible substrate and the scintillator layer, a photoelectric conversion device between the transistor and the scintillator layer, and a bias voltage line between the photoelectric conversion device and the scintillator layer. A bottom electrode of the photoelectric conversion device is electrically connected to the transistor, and the bias voltage line is electrically connected to a top electrode of the photoelectric conversion device.

Accordingly, embodiments of the disclosure further provide a flat panel detector. The flat panel detector includes the detection substrate of any one as provided above in embodiments of the disclosure.

Accordingly, embodiments of the disclosure further provide a manufacturing method for a detection substrate, which is used for manufacturing the detection substrate of any one above provided in embodiments of the disclosure. The manufacturing method includes: forming a scintillator layer on the side of a flexible substrate, where the scintillator layer comprises the central portion and the peripheral portion on at least one side of the central portion, the central portion and the peripheral portion are of an integrated structure, the thickness of the central portion at each position is approximately equal, and in the direction from the edge of the flexible substrate to the center of the flexible substrate, the thickness of the peripheral portion progressively increases; and forming a reinforcement structure on the side of the flexible substrate, where the reinforcement structure and the scintillator layer are disposed on the same side of the flexible substrate, and the reinforcement structure at least covers part of the peripheral portion.

In some embodiments, in the above manufacturing method provided in embodiments of the disclosure, the flexible substrate includes a bonding area and a non-bonding area. Forming the scintillator layer on the side of the flexible substrate further includes: removing the peripheral portion on the side of the non-bonding area of the flexible substrate, and obtaining the scintillator layer comprising the central portion and the peripheral portion located on the side of the bonding area of the flexible substrate.

In some embodiments, in the above manufacturing method provided in embodiments of the disclosure, after the forming the reinforcement structure, the manufacturing method further includes: placing a side of the scintillator layer on a base platform of an attaching apparatus in such a way that the side of the scintillator layer is completely attached to the base platform; and attaching a support layer to the side of the flexible substrate facing away from the scintillator layer.

In some embodiments, in the above manufacturing method provided in embodiments of the disclosure, attaching the support layer to the side of the flexible substrate facing away from the scintillator layer includes: placing the support layer on a support platform in the attaching apparatus, and attaching the support layer to the side of the flexible substrate facing away from the scintillator layer in a rolling manner.

In some embodiments, in the above manufacturing method provided in embodiments of the disclosure, after forming the scintillator layer and before forming the reinforcement structure, the manufacturing method further includes: forming an encapsulation layer on the side of the scintillator layer facing away from the flexible substrate: where the encapsulation layer completely covers the scintillator layer, an edge portion of the encapsulation layer makes contact with the flexible substrate, and the encapsulation layer is configured according to a shape of the scintillator layer.

Accordingly: embodiments of the disclosure further provide a manufacturing method for a detection substrate, which is used for manufacturing the detection substrate of any one above provided in embodiments of the disclosure. The manufacturing method includes: forming the scintillator film on the side of a flexible substrate, where the scintillator film comprising the central portion and the peripheral portion around the central portion, the central portion and the peripheral portion are of an integrated structure, the thickness of the central portion at each position is approximately equal, and in the direction from the edge of the flexible substrate to the center of the flexible substrate, the thickness of the peripheral portion progressively increases; and removing all the peripheral portion to form the scintillator layer having the approximately uniform thickness at each position.

In some embodiments, in the above manufacturing method provided in embodiments of the disclosure, after forming the scintillator layer, the manufacturing method further includes: placing a side of the scintillator layer on a base platform of an attaching apparatus in such a way that the side of the scintillator layer is completely attached to the base platform; and attaching a support layer to the side of the flexible substrate facing away from the scintillator layer.

In some embodiments, in the above manufacturing method provided in embodiments of the disclosure, the attaching the support layer to the side of the flexible substrate facing away from the scintillator layer includes: placing the support layer on a support platform in the attaching apparatus; and attaching the support layer to the side of the flexible substrate facing away from the scintillator layer in a rolling manner.

In some embodiments, in the above manufacturing method provided in embodiments of the disclosure, after forming the scintillator layer and before placing the side of the scintillator layer on the base platform of the attaching apparatus, the manufacturing method further includes: forming an encapsulation layer on the side of the scintillator layer facing away from the flexible substrate. The encapsulation layer completely covering the scintillator layer, an edge portion of the encapsulation layer makes contact with the flexible substrate, and the encapsulation layer is configured according to a shape of the scintillator layer.

Accordingly, embodiments of the disclosure further provide a manufacturing method for a detection substrate, which is used for manufacturing the detection substrate of any one above provided in embodiments of the disclosure. The manufacturing method includes: forming the scintillator layer on the side of a flexible substrate, where the scintillator layer comprises the central portion and the peripheral portion around the central portion, the central portion and the peripheral portion are of an integrated structure, the thickness of the central portion at each position is approximately equal, and in the direction the edge of the flexible substrate to the center of the flexible substrate, the thickness of the peripheral portion progressively increases: embedding a surface of the scintillator layer facing away from the flexible substrate into the concave structure of the base platform, where the concave structure is configured according to a shape of the scintillator layer; and attaching the support layer to the side of the flexible substrate facing away from the scintillator layer.

In some embodiments, in the above manufacturing method provided in embodiments of the disclosure, the attaching the support layer to the side of the flexible substrate facing away from the scintillator layer includes: placing the support layer on a support platform in the attaching apparatus, and attaching the support layer to the side of the flexible substrate facing away from the scintillator layer in a rolling manner.

In some embodiments, in the above manufacturing method provided in embodiments of the disclosure, after forming the scintillator layer and before embedding the surface of the scintillator layer facing away from the flexible substrate into the concave structure of the base platform, the manufacturing method further includes: forming an encapsulation layer on the side of the scintillator layer facing away from the flexible substrate. The encapsulation layer completely covers a surface of the scintillator layer that does not make contact with the flexible substrate, an edge portion of the encapsulation layer makes contact with the flexible substrate, and the encapsulation layer is configured according to a shape of the scintillator layer.

BRIEF DESCRIPTION OF THE DRAWINGS

FIG. 19 is a schematic flowchart of a manufacturing method for a detection substrate provided in an embodiment of the disclosure.

FIG. 20 is a schematic diagram illustrating a support layer in an attaching process in a detection substrate shown in FIG. 4.

FIG. 26 is a schematic flowchart of a manufacturing method for another detection substrate provided in an embodiment of the disclosure.

FIG. 27 is a schematic diagram illustrating a support layer in an attaching process in a detection substrate shown in FIG. 10.

DETAILED DESCRIPTION

Figure 1:
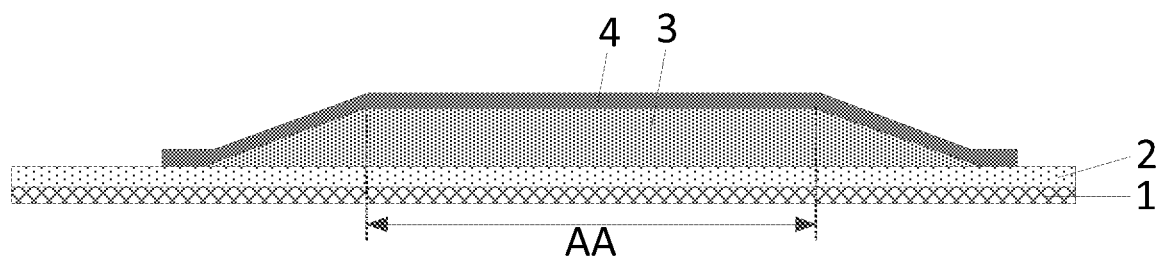
FIG. 1 is a schematic diagram of an ideal structure of a detection substrate in the related art.

In order to make the objectives, technical solutions and advantages of embodiments of the disclosure clearer, the technical solutions in the embodiments of the disclosure will be clearly and completely described below in combination with the accompanying drawings in the embodiments of the disclosure. Obviously, the embodiments described are some embodiments rather than all embodiments of the disclosure. The embodiments in the disclosure and the features in the embodiments can be combined with each other without conflict. On the basis of the embodiments described of the disclosure, all other embodiments obtained by those of ordinary skill in the art without making creative efforts all fall within the scope of protection of the disclosure.

Unless otherwise indicated, the technical terms or the scientific terms used in the disclosure should have the common meanings as understood by those of ordinary skill in the art to which the disclosure belongs. Similar words of "comprise", "include", etc, used in the disclosure mean that elements or items appearing before the word encompass elements or items listed after the word and equivalents of the elements or items without excluding other elements or items. Similar words of "connection", "connected", etc, are not limited to physical or mechanical connections, but may include electrical connections, whether direct or indirect. "Inside", "outside" "upper", "lower", etc, are only used to represent a relative position relation. After an absolute position of a described object is changed, the relative position relation can also be changed accordingly.

It should be noted that the size and shape of each figure in the accompanying drawings do not reflect the true scales, and are only intended to illustrate the contents of the disclosure. Identical or similar reference numerals denote identical or similar elements or elements having identical or similar functions throughout.

Figure 2:
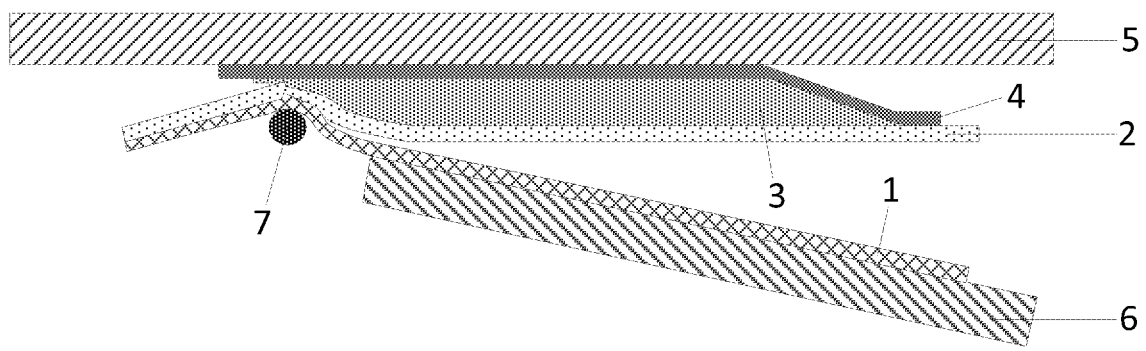
FIG. 2 is a schematic diagram illustrating a support layer in a detection substrate in an attaching process in the related art.
Figure 3:
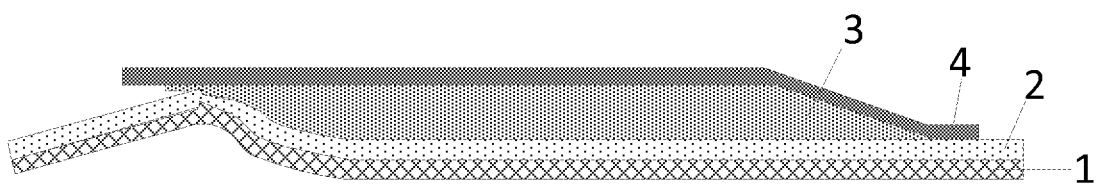
FIG. 3 is a schematic diagram of an actual structure of a detection substrate in the related art.

With increasing demands (for example, more thinner, lighter, better power saving performance, more durable, non-fragility, more portable, etc.) for a mobile flat panel detector, the flexible flat panel detector has been regarded as a next generation device to replace an existing glass substrate flat panel detector. In the related art, as shown in FIG. 1, a flexible flat panel detector usually includes a support layer 1, a flexible substrate 2, a thin film transistor (not shown), a photodiode (not shown), a scintillator layer 3 and an encapsulation layer 4 that are disposed in stack. A manufacturing process of the flexible flat panel detector is roughly as follows: the flexible substrate 2, the thin film transistor (not shown), the photodiode (not shown), the scintillator layer 3 and the encapsulation layer 4 that are disposed in stack are formed on a rigid substrate, then the rigid substrate is stripped, and then the support layer 1 is attached to a side of the flexible substrate 2 facing away from the scintillator layer 3 in a rolling manner. The scintillator layer 3 is usually manufactured by evaporation, which has better properties compared with that manufactured by an attaching manner, and has specific advantages in terms of a shorter fluorescence path and less scattering. For a detection substrate having a planar structure, an ideal structure of the scintillator layer 3 is that the scintillator layer 3 having a uniform thickness is only formed in a photosensitive area (AA area) of the flat panel detector. Due to an influence of a manufacturing process, the scintillator layer 3 has a slope area (a slope portion of the scintillator layer 3 shown in FIG. 1) at an edge of an outer side of the AA area, and therefore the scintillator layer 3 has an edge dummy area while encapsulated, such that there is a height gap between the AA area and the edge area of the scintillator layer 3. A structure shown in FIG. 1 is an ideal flat panel detector having a planar structure. However, during an attaching process of the support layer 1, as shown in FIG. 2. FIG. 2 is a schematic diagram showing that a structure after a rigid substrate is stripped is placed in an attaching apparatus, the support layer 1 is attached to a side of the flexible substrate 2 facing away from the scintillator layer 3 in a rolling manner, the encapsulation layer 4 is sucked by a base platform 5 in the attaching apparatus, and the support layer 1 is placed on a support platform 6. It may be seen that since there is a height gap between the AA area and the edge area of the scintillator layer 3, edges of both the flexible substrate 2 and the support layer 1 are warping in a rolling process using a roller 7, and the roller 7 raises the scintillator layer 3 in the edge area to one side of the base platform 5, resulting in deformation of the scintillator layer 3 in the edge area. As shown in FIG. 3. FIG. 3 is a structure of an actually formed flexible flat panel detector, the flexible substrate 2 and the support layer 1 warp at an edge, resulting in unevenness, and due to deformation of the scintillator layer 3, the scintillator layer 3 is damaged, resulting in the problem of defect in a bright image.

In view of this, embodiments of the disclosure provide a detection substrate. As shown in FIGS. 4-9, the detection substrate includes:

a flexible substrate 2;

a scintillator layer 3 disposed on a side of the flexible substrate 2, the scintillator layer 3 including a central portion 31 and a peripheral portion 32 on at least one side of the central portion 31, the central portion 31 and the peripheral portion 32 being of an integrated structure, a thickness H1 of the central portion 31 at each position is approximately equal, and in a direction (which is shown by an arrow L) from an edge of the flexible substrate 2 to a center of the flexible substrate 2, a thickness of the peripheral portion 32 progressively increases; and a reinforcement structure 8, the reinforcement structure 8 and the scintillator layer 3 being disposed on the same side of the flexible substrate 2, the reinforcement structure 8 at least covering part of the peripheral portion 32, and the reinforcement structure 8 having a maximum thickness H2 approximately equal to the thickness H1 of the central portion 32.

According to the above detection substrate provided in embodiments of the disclosure, since the reinforcement structure 8 on the same side as the scintillator layer 3 is disposed on the flexible substrate 2, and the reinforcement structure 8 has the maximum thickness H2 approximately equal to the thickness H1 of the central portion 31, the reinforcement structure 8 may be used for compensating for a height gap between a central area (AA area) and an edge area of the scintillator layer 3, thus subsequently, while a support layer 1 (introduced later) is attached to one side of the flexible substrate 2 facing away from the scintillator layer 3, the scintillator layer 3 will be subjected to an approximately uniform force at each position in a rolling process using a roller 7, and therefore an edge of the scintillator layer 3 may not be raised by the roller 7, and the scintillator layer 3 may not deform, such that the problem of defect in a bright image may not be caused, and performance of the detection substrate may be improved.

It should be noted that the embodiment of the disclosure is described with the detection substrate being a planar structure as an example, and certainly, during a specific implementation, the detection substrate provided in embodiments of the disclosure may also be of a curved structure.

During a specific implementation, when the detection substrate provided in embodiments of the disclosure is the planar structure, the peripheral portion 32 of the scintillator layer 3 is a slope portion (slope area), and the central portion 31 is a flat portion having an approximately uniform thickness.

Optionally, a material of the flexible substrate may include, but not limited to, plastic substrates having excellent heat resistance and durability, such as polyimide, polyvinyl ether phthalate, polyethylene naphthalate, polycarbonate, polyarylate, polyetherimide, polyethersulfone, etc.

Specifically, a material of the scintillator layer is a material that may convert X-light into visible light, and mainly consists of a scintillator. The scintillator is a type of material that may emit light after absorbing energetic particles or rays, is usually processed into a crystal in use, and is called as a scintillator crystal. Material of the scintillation crystal of the scintillator layer is not limited in embodiments of the disclosure, which may be cesium iodide (CsI), cadmium tungstate, barium fluoride, gadolinium oxysulfide (GOS), etc.

Preferably, as shown in FIGS. 4-9, the reinforcement structure 8 completely covers the peripheral portion 32, such that while one side of the flexible substrate 2 facing away from the scintillator layer 3 is attached with the support layer 1 (introduced later), the scintillator layer 3 is subjected to a uniform force at each position in the rolling process using the roller 7.

During a specific implementation, in the above detection substrate provided in embodiments of the disclosure, as shown in FIGS. 4-9, the reinforcement structure 8 has a maximum thickness H2 less than or equal to the thickness H1 of the central portion 31 and greater than or equal to 50% of the thickness H1 of the central portion 31. Thus, it may be ensured that the reinforcement structure 8 has an effect of compensating for the height gap between the AA area and the edge area of the scintillator layer 3.

During a specific implementation, in the above detection substrate provided in embodiments of the disclosure, as shown in FIGS. 4-9, the reinforcement structure 8 has the maximum thickness H2 approximately equal to the thickness of the central portion 31. Thus, the reinforcement structure 8 may almost completely compensate for the height gap between the AA area and the edge area of the scintillator layer 3, such that the problem of deformation of the scintillator layer 3 may be further avoided.

During a specific implementation, in the above detection substrate provided in embodiments of the disclosure, as shown in FIGS. 4-9, a preset distance D is provided between an edge of an orthographic projection of the peripheral portion on the flexible substrate 2 close to an edge of the flexible substrate 2 and the edge of the flexible substrate 2, and the reinforcement structure 8 further covers at least part of an area of the flexible substrate 2 that is not covered with the peripheral portion 32. Preferably, the reinforcement structure 8 covers at least part of the area of the flexible substrate 2 that is not covered with the peripheral portion 32. Thus, in embodiments of the disclosure, while one side of the flexible substrate 2 facing away from the scintillator layer 3 is attached with the support layer 1, the flexible substrate 2 is subjected to a uniform force at each position in a rolling process using the roller 7, edges of both the flexible substrate 2 and the support layer 1 may not warp, and it may be further ensured that an edge of the scintillator layer 3 may not be raised by the roller 7, such that surfaces of the support layer 1 and the flexible substrate 2 those are in contact with each other are located in a flat plane, and it is ensured that the scintillator layer 3 may not deform.

Figure 4:
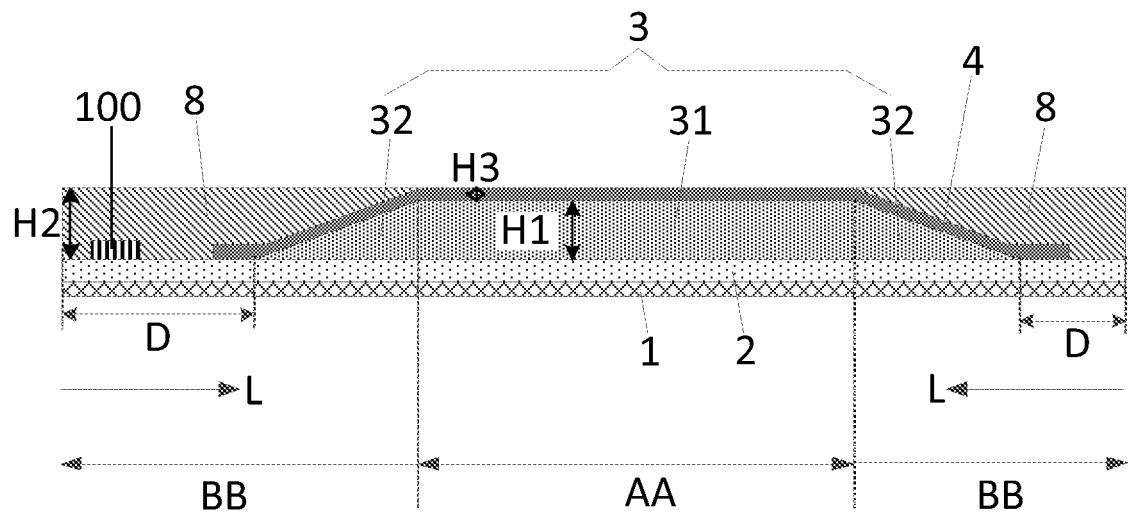
FIGS. 4-10 and 11A each is schematic diagram of a structure of a detection substrate provided in an embodiment of the disclosure.
Figure 5:
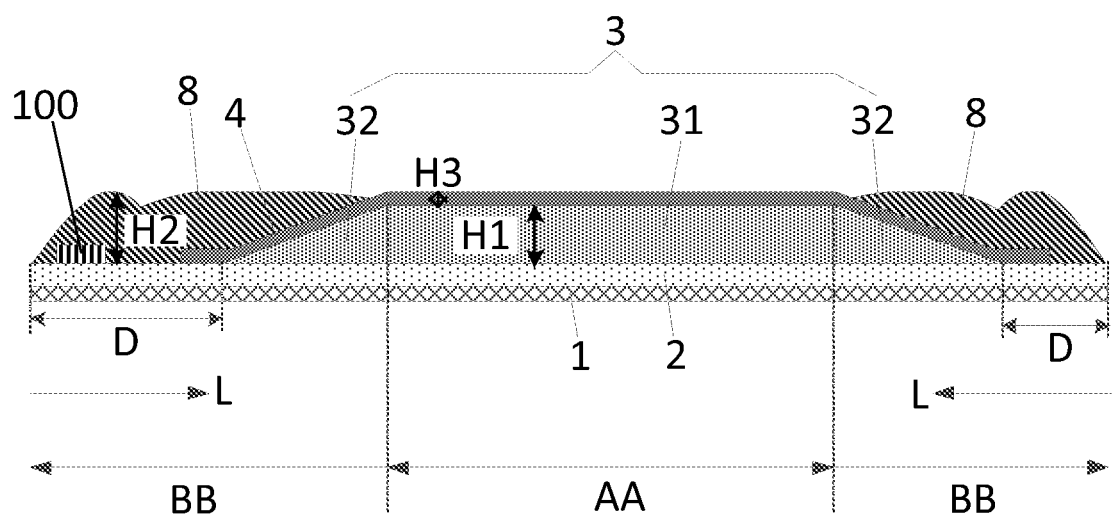
Figure 6:
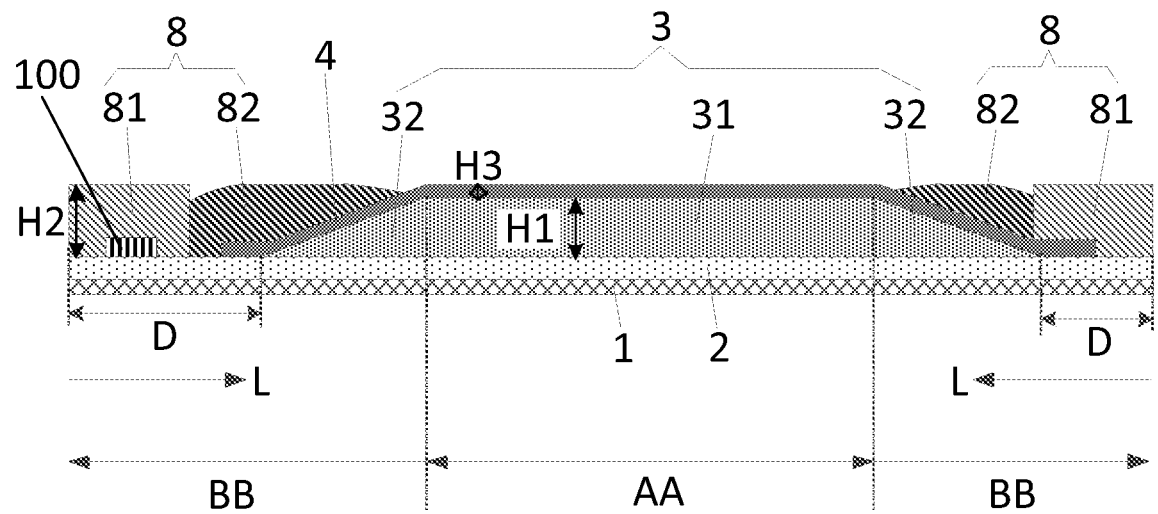

During a specific implementation, in the above detection substrate provided in embodiments of the disclosure, as shown in FIGS. 4-6, the flexible substrate 2 includes a photosensitive area AA and a peripheral area BB around the photosensitive area AA. The central portion 31 is located in the photosensitive area AA, the peripheral portion 32 is located in the peripheral area BB, and the peripheral portion 32 is around the central portion 31. Thus, the reinforcement structure 8 around the central portion 31 is arranged on the peripheral portion 32, thereby compensating for the gap between the central portion 31 and the peripheral portion 32 around the central portion, such that while one side of the flexible substrate 2 facing away from the scintillator layer 3 is attached with the support layer 1, the flexible substrate 2 is subjected to a uniform force at each position in the rolling process using the roller 7, and the problems of warp of the flexible substrate 2 and the support layer 1 in the edge area and deformation of the scintillator layer 3 are avoided.

Figure 7:
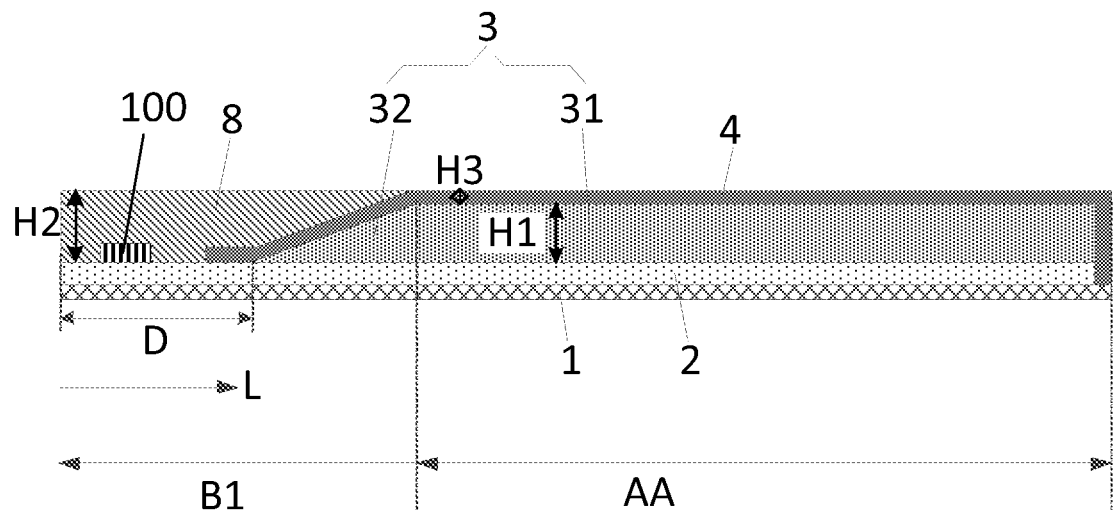
Figure 8:
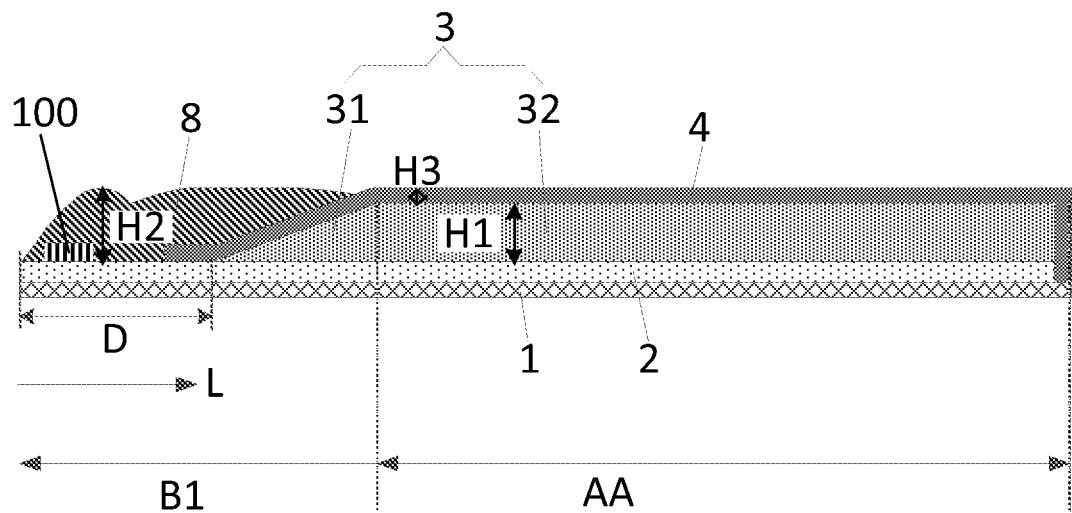
Figure 9:
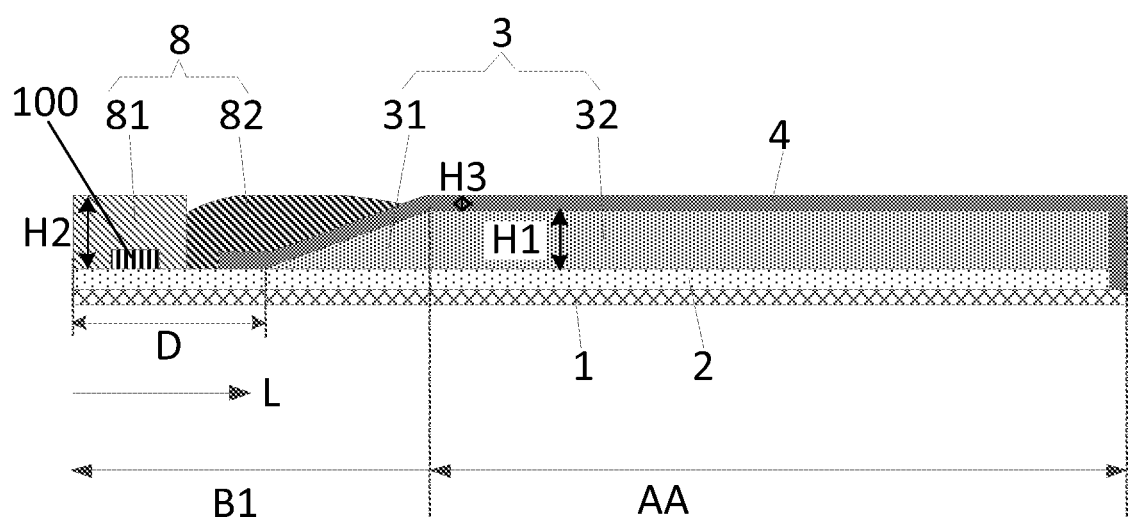

During a specific implementation, in the above detection substrate provided in embodiments of the disclosure, as shown in FIGS. 7-9, the flexible substrate 2 includes a photosensitive area AA and a peripheral area arranged around the photosensitive area AA. The peripheral area includes a bonding area B1 and a non-bonding area, and the scintillator layer 3 is provided with the peripheral portion 32 only on one side of the bonding area B1. Specifically, when an evaporation method is used to form the scintillator layer 3, due to an influence of a manufacturing process, the initially formed scintillator layer 3 is a structure in which a peripheral portion 32 is formed around the central portion 31 shown in FIGS. 4-6, while the scintillator layer 3 shown in FIGS. 7-9 of the embodiment of the disclosure is provided with the peripheral portion 32 only on one side of the bonding area B1. That is, the embodiment of the disclosure may adjust the structure of the initially formed scintillator layer 3. For example, the peripheral portion 32 on the side of the non-bonding area is removed, and only the peripheral portion 32 disposed on one side of the bonding area B1 is reserved. Since the bonding area B1 is generally provided with a bonding pad for electrically connecting a signal line (for example, a scan signal line (SL) and a read signal line (RL)) of a photosensitive area AA with an external chip. In order to prevent damage to the signal line of the bonding area B1 and the external chip while the peripheral portion 32 is removed, only the peripheral portion 32 of the non-bonding area is removed in embodiments of the disclosure. Thus, due to arrangement of the reinforcement structure 8, a gap between the central portion 31 and the peripheral portion 32 of the scintillator layer 3 in the area with the peripheral portion 32 reserved may be avoided. The area in which the peripheral portion 32 is removed does not have a gap area, and therefore the problems of warp of the flexible substrate 2 and the support layer 1 and deformation of the scintillator layer 3 may be avoided.

Specifically. FIGS. 4-9 all take an example in which the central portion 31 is located in the photosensitive area AA and the peripheral portion 32 is located in the peripheral area BB. Certainly, during a specific implementation, in the above detection substrate provided in embodiments of the disclosure, as shown in FIGS. 12-17, the central portion 31 is located in the photosensitive area AA, and the peripheral portion 32 may be at least partially located in the photosensitive area AA. For example, one part of the peripheral portion 32 is located in the photosensitive area AA, and the other part of the peripheral portion is located in the peripheral area BB. For another example, the peripheral portion 32 is completely located in the photosensitive area AA. However, due to the influence of the manufacturing process, it is difficult to make the peripheral portion 32 completely located in the photosensitive area AA, or make the peripheral portion 32 completely located in the peripheral area BB (FIGS. 4-9). FIGS. 12-17 of the embodiment of the disclosure take an example in which one part of the peripheral portion 32 is located in the photosensitive area AA, and the other part of the peripheral portion is located in the peripheral area BB. However, regardless of the location of the peripheral portion 32, the reinforcement structure 8 provided in embodiments of the disclosure may be used for compensating for the height gap as long as the peripheral portion has a non-uniform thickness.

During a specific implementation, in the above detection substrate provided in embodiments of the disclosure, as shown in FIGS. 4, 5, 7, 8, 12, 13, 15 and 16, the reinforcement structure 8 may be an integrated structure. Specifically, as shown in FIGS. 4, 5, 12 and 13, the reinforcement structure 8 is a closed integrated structure arranged around the central portion 31: or as shown in FIGS. 7, 8, 15 and 16, the reinforcement structure 8 is a non-closed integrated structure only arranged in the bonding area B1.

During a specific implementation, in the above detection substrate provided in embodiments of the disclosure, as shown in FIGS. 4, 5, 7, 8, 12, 13, 15 and 16, a material of the reinforcement structure 8 being the integrated structure may include, but not limited to, a tape adhesive or an ultraviolet (UV) adhesive. Specifically, as shown in FIGS. 4, 7, 12 and 15, the material of the reinforcement structure 8 is the tape adhesive, and the tape adhesive is a type of thick tape. Currently, the tape adhesive is mostly attached manually, and requires repeated correction to improve an alignment effect and make the surface flush. As shown in FIGS. 5, 8, 13 and 16, the material of the reinforcement structure 8 is the UV adhesive, the UV adhesive is a liquid when coated, and has a certain fluidity and wetting angle, and therefore the surface of the reinforcement structure may not be completely flat after the reinforcement structure formed of the UV adhesive is cured. The UV adhesive has the advantage that the shape may be plasticized, and before UV light is irradiated to cure the UV adhesive, a location and the amount of the UV adhesive may be finely adjusted, such that a surface of the reinforcement structure 8 facing away from the flexible substrate 2 is approximately flush with a surface of the central portion 31 facing away from the flexible substrate 2.

Figure 14:
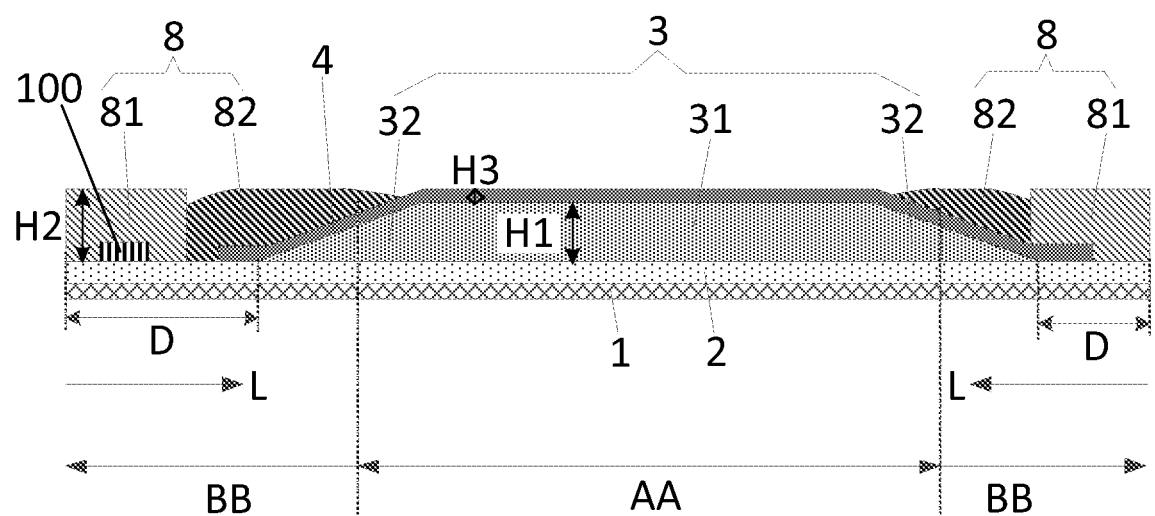
Figure 15:
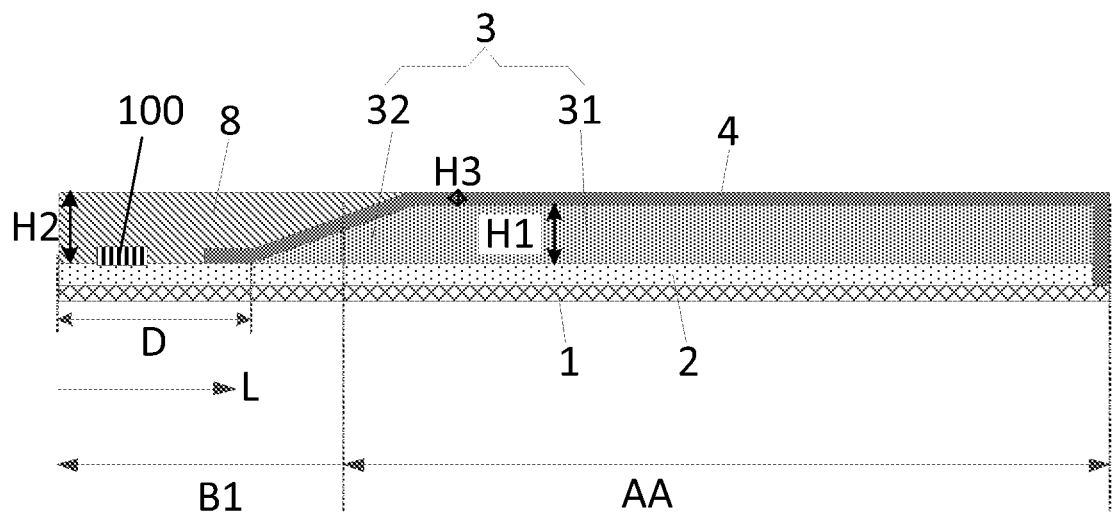
Figure 16:
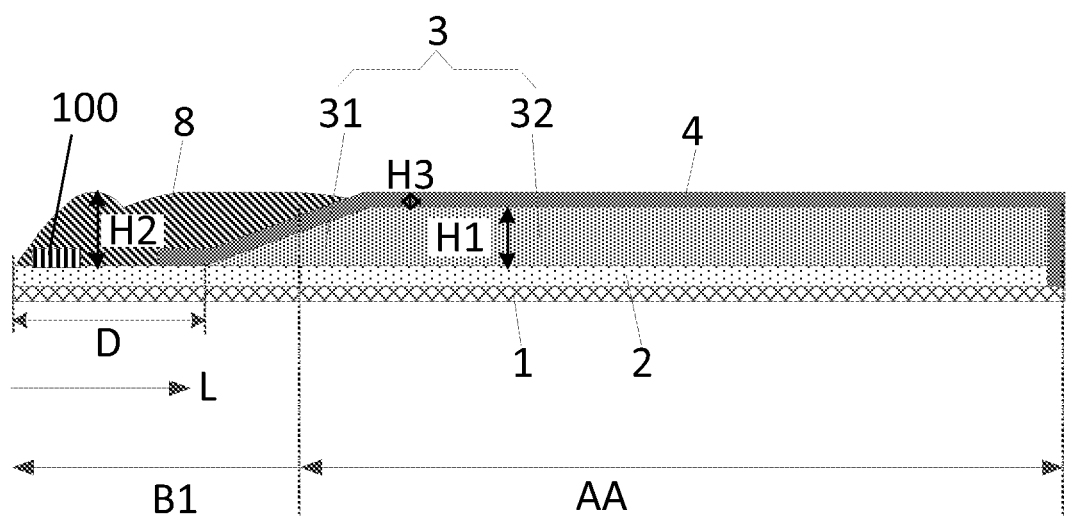
Figure 17:
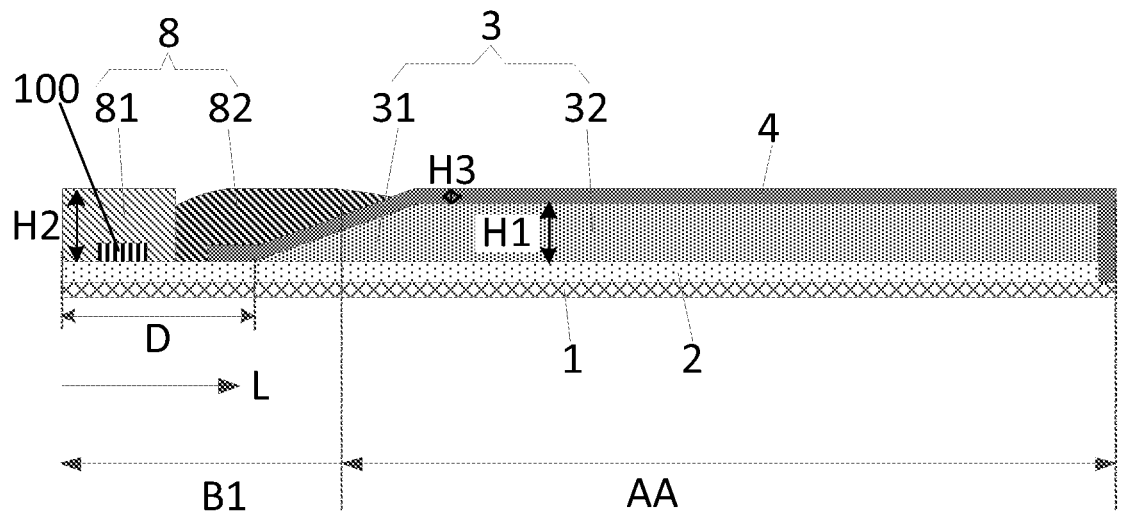

During a specific implementation, in the above detection substrate provided in embodiments of the disclosure, as shown in FIGS. 6, 9, 14 and 17, the reinforcement structure 8 may include: a first reinforcement structure 81 at one side of the peripheral portion 32 away from the central portion 31, and a second reinforcement structure 82 between the first reinforcement structure 81 and the peripheral portion 32, the first reinforcement structure 81 making contact with the second reinforcement structure 82. Specifically, as shown in FIGS. 6 and 14, the first reinforcement structure 81 and the second reinforcement structure 82 are both closed integrated structures arranged around the central portion 31; and as shown in FIGS. 9 and 17, the first reinforcement structure 81 and the second reinforcement structure 82 are both non-closed integrated structures only arranged in the bonding area B1.

During a specific implementation, in the above detection substrate provided in embodiments of the disclosure, as shown in FIGS. 6, 9, 14 and 17, a material of the first reinforcement structure 81 may include a tape adhesive, and a material of the second reinforcement structure 82 may include a UV adhesive. Thus, the tape adhesive may be used for forming the first reinforcement structure 81 at an edge of the flexible substrate 2, a groove is formed between the first reinforcement structure 81 and the central portion 32, and then the groove is filled with the UV adhesive having excellent fluidity, and the UV adhesive is cured to form the second reinforcement structure 82.

Therefore, according to the structure of the detection substrate provided in embodiments of the disclosure and shown in FIGS. 4-9 and 12-17, the reinforcement structure 8 is arranged on the peripheral portion 32 of the scintillator layer 3, such that the height gap between the central portion 31 and the peripheral portion 32 of the scintillator layer 3 may be compensated, and in an attaching process of the support layer 1, and the flexible substrate 2 may be subjected to a uniform force at each position, such that the problems of warp of the flexible substrate 2 and the support layer 1 at the edges and deformation of the scintillator layer 3 are avoided.

During a specific implementation, in the above detection substrate provided in embodiments of the disclosure, as shown in FIGS. 4-11A and 12-17, the detection substrate further includes an encapsulation layer 4 between the scintillator layer 3 and the reinforcement structure 8, where the encapsulation layer 4 completely covers the scintillator layer 3, an edge portion of the encapsulation layer 4 makes contact with the flexible substrate 2, and the encapsulation layer 4 is configured based on a shape of the scintillator layer 3. Specifically, the encapsulation layer 4 may be made of aluminum, but is not limited thereto. The encapsulation layer 4 may have an effect of a certain water oxygen barrier, and the encapsulation layer 4 avoids damage of the scintillator layer caused by collision, etc.

It should be noted that as shown in FIGS. 4-9 and 12-17, the reinforcement structure 8 has the maximum thickness H2 less than or equal to the sum of the thickness H1 of the central portion 31 and a thickness H3 of the encapsulation layer 4. Preferably. $H2=H1+H3$.

Specifically, as shown in FIGS. 7-9 and 15-17, the encapsulation layer 4 is laterally and vertically encapsulated at one side without the peripheral portion 32, and a process of coating the UV adhesive or attaching the tape adhesive may be omitted.

During a specific implementation, as shown in FIGS. 4-9 and 12-17, the peripheral area of the flexible substrate 2 has a bonding area, the bonding area is generally provided with a bonding pad, by bonding the bonding pad with a flexible printed circuit board (FPC), a Data chip on flex/chip on film (COF) 100 is formed (that is, bonding the pad on the flexible substrate 2 with the pad on the FPC, and for being connected with the read signal line RL in the photosensitive area AA), and a Gate COF 200 is formed (that is, bonding the pad on the flexible substrate 2 with the pad on the FPC and for being connected with the scan signal line SL in the photosensitive area AA), and FIGS. 4-9 and 12-17 only illustrate the Data COF 100.

Figure 18:
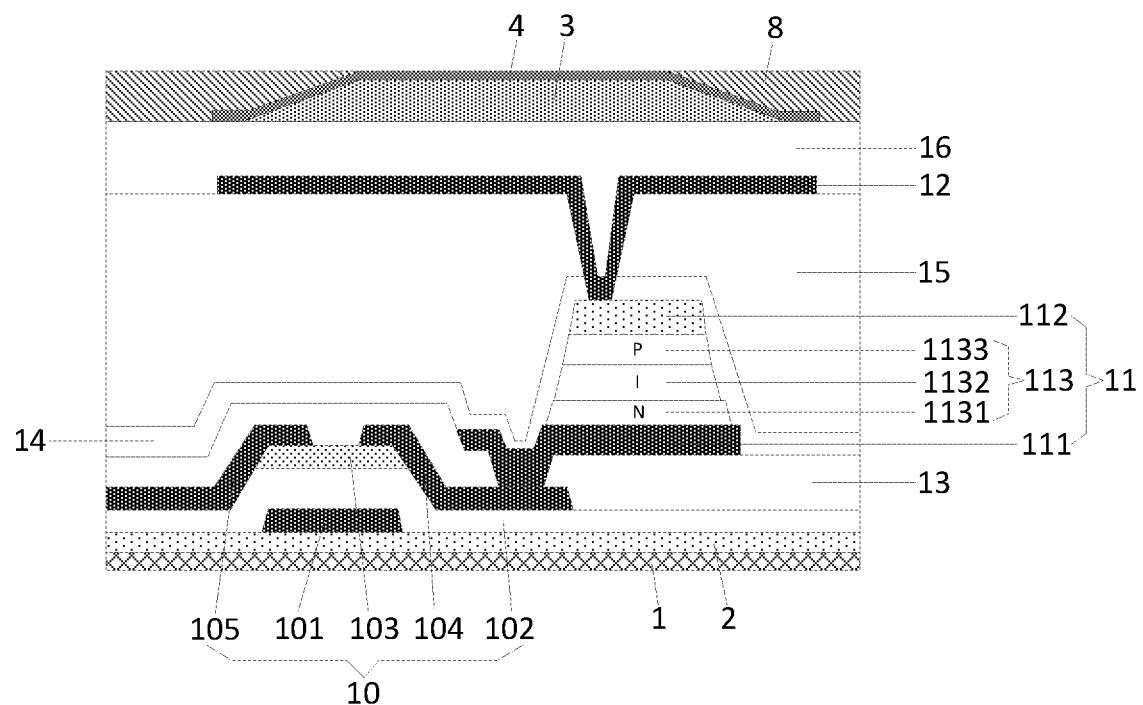
FIG. 18 is a schematic diagram of a detail structure of a detection substrate provided in an embodiment of the disclosure.

During a specific implementation, in the above detection substrate provided in embodiments of the disclosure, as shown in FIG. 18, the detection substrate further includes: a transistor 10 between the flexible substrate 2 and the scintillator layer 3, a photoelectric conversion device 11 between the transistor 10 and the scintillator layer 3, and a bias voltage line 12 between the photoelectric conversion device 11 and the scintillator layer 3, where a bottom electrode 111 of the photoelectric conversion device 11 is electrically connected with the transistor 10, and the bias voltage line 12 is electrically connected with a top electrode 112 of the photoelectric conversion device 11.

Specifically, as shown in FIG. 18, the photoelectric conversion device 11 may include a bottom electrode 111 and a top electrode 112 that are oppositely arranged, and a photoelectric conversion layer 113 between the bottom electrode 111 and the top electrode 112. The photoelectric conversion layer 113 converts a light signal into an electric signal, there is an opposite area between the bottom electrode 111 and the top electrode 112 of the photoelectric conversion device 11, a storage capacitor is formed between the bottom electrode and the top electrode, and an electrical signal converted through the photoelectric conversion layer 113 is stored in the storage capacitor.

Specifically, the photoelectric conversion layer may be a PN structure or a PIN structure. Specifically, the PIN structure includes an N-doped N-type semiconductor layer, an undoped intrinsic semiconductor layer 1 and a P-doped P-type semiconductor layer. The intrinsic semiconductor layer 1 has a thickness that may be greater than a thickness of the P-type semiconductor layer and the N-type semiconductor layer.

Specifically, as shown in FIG. 18, the photoelectric conversion layer 113 in embodiments of the disclosure includes an N-type semiconductor layer 1131, an intrinsic semiconductor layer 1132 and a P-type semiconductor layer 1133 that are sequentially disposed in stack in a direction from the flexible substrate 2 to the scintillator layer 3.

Specifically, as shown in FIG. 18, the transistor 10 may include a gate electrode 101, a gate insulation layer 102, an active layer 103, a source electrode 104 and a drain electrode 105 on the flexible substrate 2, where the bottom electrode 111 of the photoelectric conversion device 11 is electrically connected with the source electrode 104.

Specifically, as shown in FIG. 18, the detection substrate further includes: a first passivation layer 13 between the bottom electrode 111 and the source electrode 104 of the photoelectric conversion device 11, a buffer layer 14 between the bias voltage line 12 and the top electrode 112, a planarization layer 15 between the buffer layer 14 and the bias voltage line 12, and a second passivation layer 16 between the bias voltage line 12 and the scintillator layer 3. Certainly, the detection substrate may further include other film layers, such as a shielding layer.

Optionally, the transistor 10 may be an amorphous-silicon thin-film transistor, an oxide thin-film transistor, a low temperature poly-silicon (LTPS) thin-film transistor, etc.

It should be noted that FIG. 18 is a specific structure on the basis of the structure shown in FIG. 4, and certainly, the structures shown in FIGS. 5-9 and 12-17 all have film layers of the transistor 10, the photoelectric conversion device 11, the bias voltage line 12, etc, shown in FIG. 18.

A working process of the detection substrate provided in embodiments of the disclosure and shown in FIGS. 4-9 and 12-17 is as follows: the scintillator layer, under impact of energetic particles of X-rays, converts kinetic energy of the energetic particles into light energy to emit light (visible light signal), the light signal may be converted into an electrical signal by the photoelectric conversion device, and the electrical signal is read out by the transistor, so as to obtain an X-ray image by subsequent processing (including amplification, conversion, etc.) of the signal.

To sum up, the detection substrate provided in embodiments of the disclosure and shown in FIGS. 4-9 and 12-17 may solve the problems of warp of the flexible substrate and the support layer and deformation of the scintillator layer, such that the problem of the defect in the bright image may be solved, and performance of the detection substrate may be improved.

Figure 10:
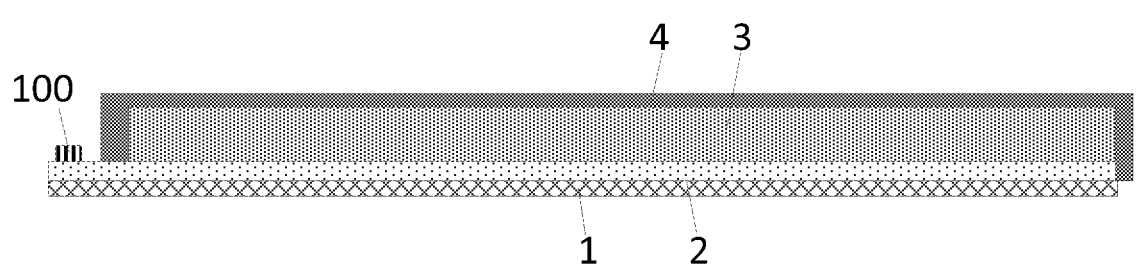

An embodiment of the disclosure further provides a detection substrate. As shown in FIG. 10, the detection substrate includes:
  a flexible substrate 2; and
  a scintillator layer 3 on a side of the flexible substrate 2, and a thickness of the scintillator layer 3 at each position is approximately equal.

According to the detection substrate provided in embodiments of the disclosure, an evaporation method is generally used to form the scintillator layer 3. When the evaporation method is used to form the scintillator layer 3, due to an influence of a manufacturing process, the initially formed scintillator layer 3 is a structure in which a peripheral portion 32 is formed around a central portion 31 shown in FIGS. 4-6. The scintillator layer 3 shown in FIG. 10 of the embodiment of the disclosure has an approximately equal thickness at each position. That is, the embodiment of the disclosure may adjust the structure of the initially formed scintillator layer 3. For example, the peripheral portion 32 at an edge around the scintillator layer 3 is removed, and only the central portion located in a photosensitive area AA is reserved (that is, the scintillator layer 3 has an approximately equal thickness at each position). Since a peripheral area of the flexible substrate 2 has a bonding area, the bonding area is generally provided with a Data COF 100 and a Gate COF 200, which are used for electrically connecting signal lines (for example, a scan signal line SL and a read signal line RL) in the photosensitive area AA with an external chip, and in order to prevent damage to the signal lines and the external chip of the bonding area B1 when the peripheral portion 32 is removed, in embodiments of the disclosure, a protective layer (for example, a silicon nitride insulation layer) may be used for protecting the signal lines and the external chip after bonding, then the peripheral portion 32 at the edge around the scintillator layer 3 is removed, and the protective layer may be removed or reserved. Thus, since the edge around the scintillator layer 3 does not have the peripheral portion 32, there is no gap area in the scintillator layer 3, such that the problem of deformation of the scintillator layer 3 may be avoided, the problem of a defect in a bright image may not be caused, and performance of the detection substrate may be improved.

During a specific implementation, in the above detection substrate provided in embodiments of the disclosure, as shown in FIG. 10, the detection substrate further includes an encapsulation layer 4 on one side of the scintillator layer 3 facing away from the flexible substrate 2. The encapsulation layer 4 completely covers the scintillator layer 3, an edge portion of the encapsulation layer 4 makes contact with the flexible substrate 2, and the encapsulation layer 4 is configured according to a shape of the scintillator layer 3. Specifically, the encapsulation layer 4 may be made of aluminum, but is not limited thereto; and the encapsulation layer 4 may have an effect of a certain water oxygen barrier, and the encapsulation layer 4 avoids damage of the scintillator layer caused by collision, etc.

Specifically, as shown in FIG. 10, the peripheral portion 32 all is removed, and therefore the encapsulation layer 4 may be laterally and vertically encapsulated around the scintillator layer 3, such that an overall film layer of the scintillator layer 3 has a uniform thickness, and the process of coating the UV adhesive or attaching the tape adhesive is thoroughly omitted.

During a specific implementation, between the flexible substrate 2 and the scintillator layer 3 of the detection substrate provided in embodiments of the disclosure and shown in FIG. 10, a transistor 10, a photoelectric conversion device 11 and a bias voltage line 12 shown in FIG. 18 are also included. Reference may be made to the description of relevant structures in FIG. 18 for details, which are not repeated herein.

Figure 11A:
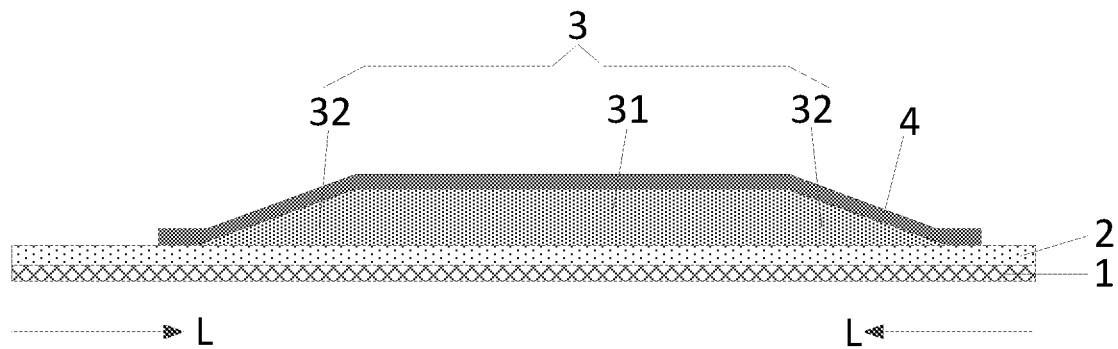
Figure 11B:
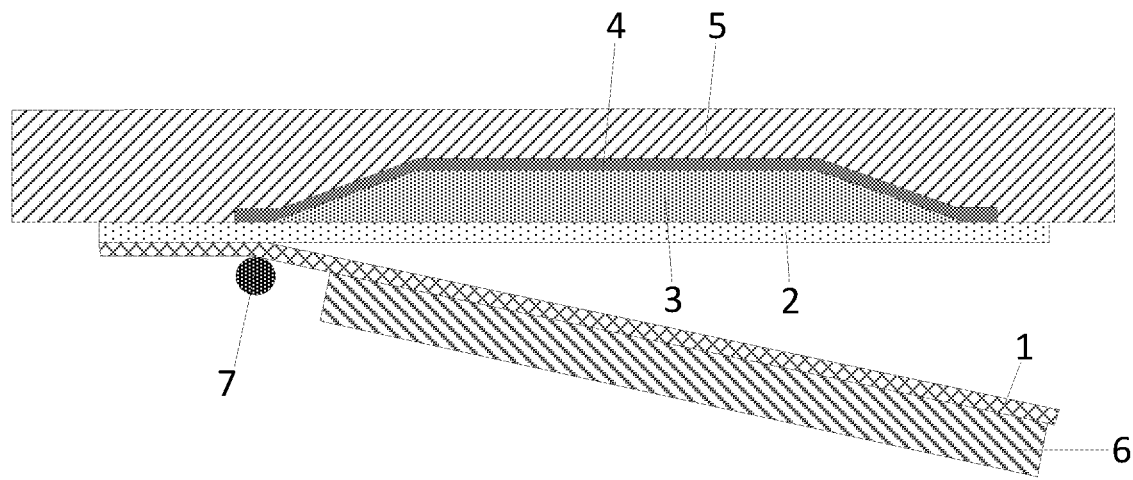
FIG. 11B is a schematic diagram illustrating a support layer in an attaching process in a detection substrate shown in FIG. 11A.
Figure 12:
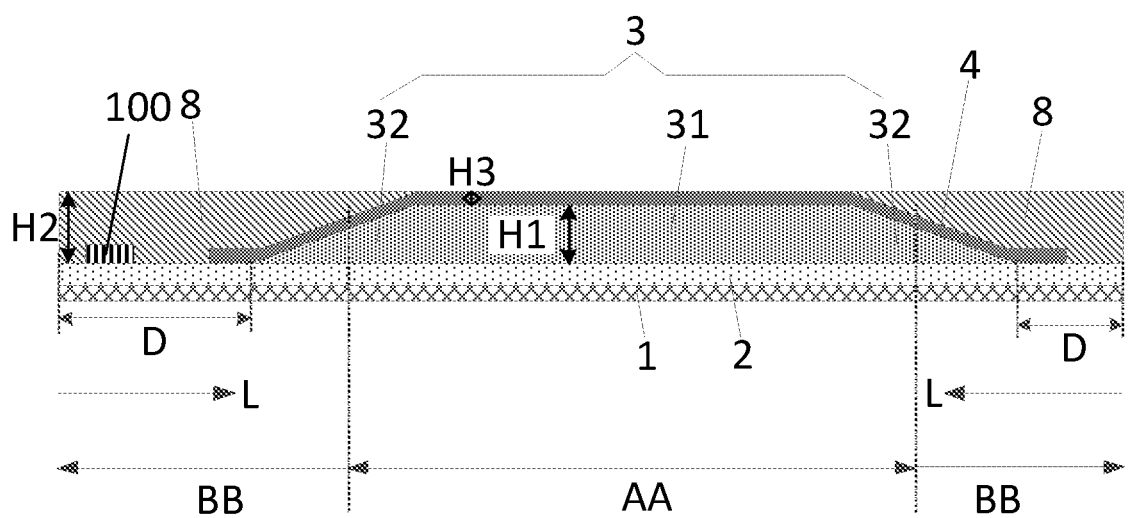
FIGS. 12-17 each is a schematic diagram of a structure of a detection substrate provided in an embodiment of the disclosure.
Figure 13:
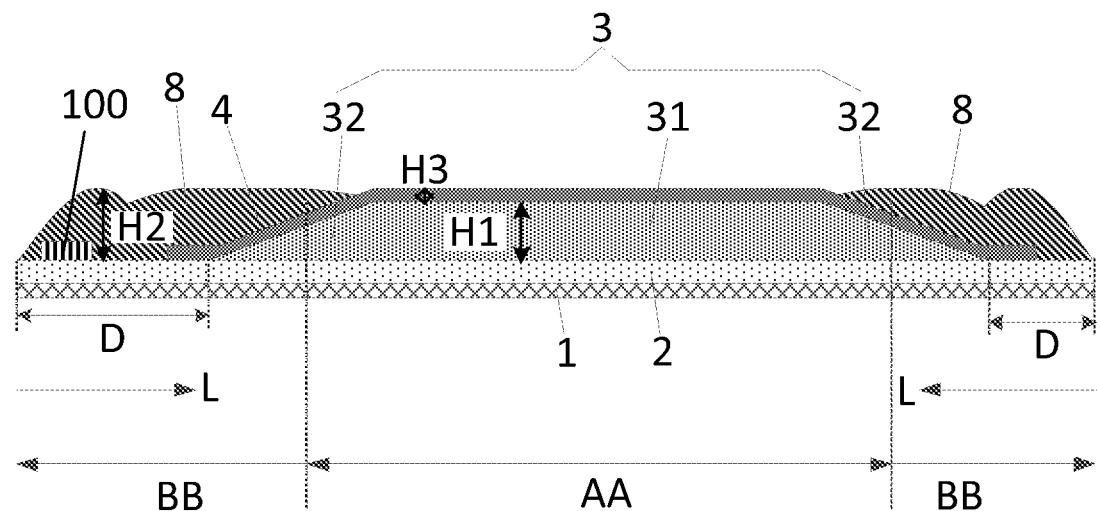

An embodiment of the disclosure further provides a detection substrate. As shown in FIG. 11A, the detection substrate includes:
  a flexible substrate 2;
  a scintillator layer 3 on one side of the flexible substrate 2, the scintillator layer 3 including a central portion 31 and a peripheral portion 32 located around the central portion 31, the central portion 31 and the peripheral portion 32 being of an integrated structure, a thickness H1 at each position of the central portion 31 is approximately equal, and in a direction (which is shown by an arrow L) from an edge of the flexible substrate 2 to a center of the flexible substrate, a thickness of the peripheral portion 32 progressively increases; and
  a support layer 1 on one side of the flexible substrate 2 facing away from the scintillator layer 3, as shown in FIG. 11B, when a base platform 5 of an attaching apparatus is used for attaching the support layer 1 on one side of the flexible substrate 2 facing away from the scintillator layer 3, the scintillator layer 3 being configured to be embedded into a concave structure of the base platform 5 designed according to a shape the scintillator layer.

During a specific implementation, in the above detection substrate provided in embodiments of the disclosure, as shown in FIG. 11A, the detection substrate shown in FIG. 11A is not provided with a reinforcement structure as shown in FIGS. 4-9 and 12-17, and does not remove all the peripheral portion like FIG. 10. When one side of the flexible substrate 2 away from the scintillator layer 3 is attached with the support layer 1 in the detection substrate shown in FIG. 11A, as shown in FIG. 11B, a base platform 5 of an attaching apparatus may be used to attach the support layer 1 on one side of the flexible substrate 2 facing away from the scintillator layer 3, the scintillator layer 3 is configured to be embedded into a concave structure of the base platform 5 configured according to a shape of the scintillator layer. Specifically, as shown in FIG. 11B, the base platform 5 having the concave structure is used, one side of the scintillator layer 3 facing away from the flexible substrate 2 may be accommodated in the concave structure of the base platform 5. That is, the base platform 5 has the concave structure matching with one side of the scintillator layer 3 facing away from the flexible substrate 2, and the support layer 1 is disposed on a support platform 6 such that when the support layer 1 is attached, a film layer has a uniform thickness at each position on one side of the flexible substrate 2 away from the support layer 1, and therefore the flexible substrate 2 is subjected to a uniform force at each position, such that the problems of warp of the flexible substrate 2 and the support layer 1 and deformation of the scintillator layer 3 may be avoided. Therefore, when the base platform 5 having the concave structure matching with one side of the scintillator layer 3 facing away from the flexible substrate 2 is used, it is possible to obtain the detection substrate in which none of the flexible substrate 2, the support layer 1 and the scintillator layer 3 deform.

During a specific implementation, in the above detection substrate provided in embodiments of the disclosure, as shown in FIG. 11A, the detection substrate further includes an encapsulation layer 4 on one side of the scintillator layer 3 facing away from the flexible substrate 2. The encapsulation layer 4 completely covers the scintillator layer 3, an edge portion of the encapsulation layer 4 makes contact with the flexible substrate 2, and the encapsulation layer 4 is configured according to a shape of the scintillator layer 3. Specifically, the encapsulation layer 4 may be made of aluminum, but is not limited thereto; and the encapsulation layer 4 may have an effect of a certain water oxygen barrier, and the encapsulation layer 4 avoids damage of the scintillator layer caused by collision, etc.

During a specific implementation, between the flexible substrate 2 and the scintillator layer 3 of the detection substrate provided in embodiments of the disclosure and shown in FIG. 11A, a transistor 10, a photoelectric conversion device 11 and a bias voltage line 12 shown in FIG. 18 are also included. Reference may be made to the description of relevant structures in FIG. 18 for details, which are not repeated herein.

In view of the above, the detection substrate provided in embodiments of the disclosure and shown in FIG. 11 may solve the problems of warp of the flexible substrate 2 and the support layer 1 and deformation of the scintillator layer 3, such that the problem of the defect in the bright image may be solved and performance of the detection substrate may be improved.

On the basis of the same inventive concept, embodiments of the disclosure further provide a manufacturing method for a detection substrate, which is used for manufacturing the detection substrate provided in embodiments of the disclosure and shown in FIGS. 4-9 and 12-17. As shown in FIG. 19, the manufacturing method includes:
  S1901, forming a scintillator layer on a side of a flexible substrate, the scintillator layer including a central portion and a peripheral portion located on at least one side of the central portion, the central portion and the peripheral portion being of an integrated structure, the central portion having an approximately uniform thickness at each position, and in a direction from an edge of the flexible substrate to a center of the flexible substrate, a thickness of the peripheral portion progressively increases; and
  S1902, forming a reinforcement structure on a side of the flexible substrate, the reinforcement structure and the scintillator layer being disposed on the same side of the flexible substrate, and the reinforcement structure at least covering part of the peripheral portion.

According to the above manufacturing method for a detection substrate provided in embodiments of the disclosure and the detection substrate provided in embodiments of the disclosure, since the reinforcement structure located on the same side as the scintillator layer is arranged on the flexible substrate, and the reinforcement structure has a maximum thickness approximately equal to a thickness of the central portion, the reinforcement structure may compensate for a height gap between a central area and an edge area of the scintillator layer, thus when a support layer (introduced later) is attached to one side of the flexible substrate facing away from the scintillator layer subsequently, the scintillator layer is subjected to an approximately uniform force at each position in a rolling process of a roller, and therefore an edge of the scintillator layer may not be raised by the roller, and the scintillator layer may not deform, such that the problem of a defect in a bright image may not be caused, and performance of the detection substrate may be improved.

During a specific implementation, in the above manufacturing method provided in embodiments of the disclosure, forming a scintillator layer on the side of a flexible substrate may include: forming, by evaporation, the scintillator layer including a central portion and a peripheral portion located on at least one side of the central portion on the flexible substrate.

Specifically, as shown in FIGS. 4-6 and 12-14, the scintillator layer 3 including the central portion 31 and the peripheral portion 32 located around the central portion 31 on the flexible substrate 2 is formed by evaporation.

During a specific implementation, in the above manufacturing method provided in embodiments of the disclosure, the flexible substrate includes a bonding area and a non-bonding area; and forming a scintillator layer on the side of a flexible substrate may include: removing the peripheral portion on a side of the non-bonding area of the flexible substrate, and forming the scintillator layer including the central portion and the peripheral portion located on a side of the bonding area of the flexible substrate.

Specifically, the scintillator layer 3 including the central portion 31 and the peripheral portion 32 located around the central portion 31 is formed by evaporation on the flexible substrate 2, and then the peripheral portion 32 on the side of the non-bonding area of the flexible substrate 2 is removed to form the scintillator layer 3 including the central portion 31 and the peripheral portion 32 located on side of the bonding area B1 of the flexible substrate 2, which is shown in FIGS. 7-9 and 15-17.

During a specific implementation, in the above manufacturing method provided in embodiments of the disclosure, as shown in FIGS. 4-9 and 12-17, after forming a reinforcement structure 8, the manufacturing method further includes:

placing a side of the scintillator layer 3 on a base platform 5 of an attaching apparatus, in such a way that the side of the scintillator layer 3 is completely attached to the base platform 5; and attaching a support layer 1 to a side of the flexible substrate 2 facing away from the scintillator layer 3.

During a specific implementation, in the above manufacturing method provided in embodiments of the disclosure, as shown in FIGS. 4-9 and 12-17, attaching the support layer 1 to the side of the flexible substrate 2 facing away from the scintillator layer 3 may include:

placing the support layer on a support platform in the attaching apparatus, and attaching the support layer to a side of the flexible substrate facing away from the scintillator layer in a rolling manner.

During a specific implementation, in the manufacturing method provided in embodiments of the disclosure, as shown in FIGS. 4-9 and 12-17, after the forming a scintillator layer and before the forming a reinforcement structure, the manufacturing method further includes:

forming an encapsulation layer on a side of the scintillator layer facing away from the flexible substrate, the encapsulation layer completely covering the scintillator layer, an edge portion of the encapsulation layer making contact with the flexible substrate, and the encapsulation layer being configured according to a shape of the scintillator layer.

Specifically, as shown in FIGS. 4-9 and 12-17, after the scintillator layer 3 is formed, and before the reinforcement structure 8 is formed, the encapsulation layer 4 is formed on one side of the scintillator layer 3 facing away from the flexible substrate 2; and the encapsulation layer 4 completely makes contact and covers a surface of the scintillator layer 3 that does not make contact with the flexible substrate 2, and the edge portion of the encapsulation layer 4 makes contact with the flexible substrate 2, and the encapsulation layer 4 is configured according to a shape of the scintillator layer 3.

Manufacturing methods for a detection substrate provided in embodiments of the disclosure and shown in FIGS. 4-9 are described in detail as below:

The manufacturing method for a detection substrate shown in FIG. 4 includes: sequentially forming a flexible substrate 2, a transistor 10, a first passivation layer 13, a photoelectric conversion device 11, a buffer layer 14, a flat layer 15, a bias voltage line 12 and a second passivation layer 16 that are disposed in stack on a rigid substrate (for example, a glass substrate): then forming a scintillator layer 3 including a central portion 31 and a peripheral portion 32 located around the central portion 31 on the second passivation layer 16 by evaporation: forming an encapsulation layer 4 on the scintillator layer 3, the encapsulation layer 4 making contact with the flexible substrate 2: forming a reinforcement structure 8 on the encapsulation layer 4 by using a tape adhesive; and stripping the rigid substrate by laser stripping. As shown in FIG. 20, a structure in which the rigid substrate is stripped is placed on a base platform 5 of an attaching apparatus, the base platform 5 sucks one side of the encapsulation layer 4 facing away from the flexible substrate 2, the attaching apparatus further includes a support platform 6, a support layer 1 is placed on the support platform 6, and a roller 7 is used for attaching the support layer 1 to one side of the flexible substrate 2 facing away from the scintillator layer 3. Since the reinforcement structure 8 may compensate for a gap between the central portion 31 and the peripheral portion 32 of the scintillator layer 3, the flexible substrate 2 and the support layer 1 do not warp in a rolling process using the roller 7 and are both of flat structures, and the scintillator layer 3 is also not raised by the roller 7, that is, the scintillator layer 3 does not deform.

It should be noted that FIG. 4 only shows the support layer 1, the flexible substrate 2, the scintillator layer 3, the encapsulation layer 4 and the reinforcement structure 8.

Figure 21:
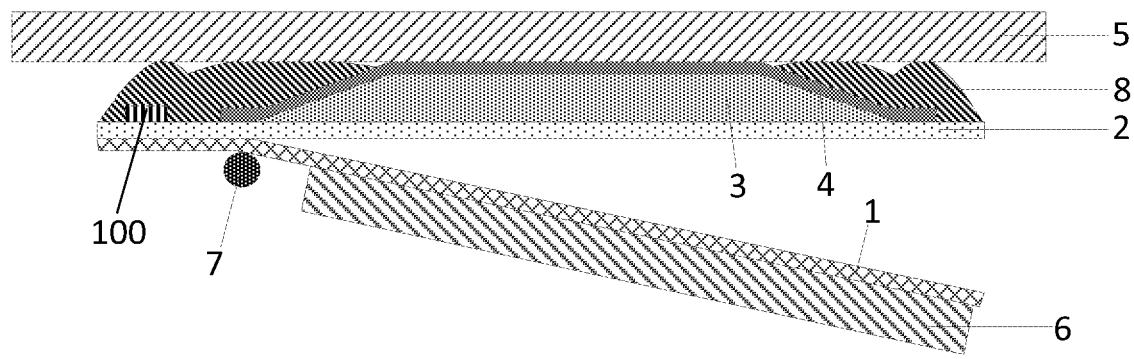
FIG. 21 is a schematic diagram illustrating a support layer in an attaching process in a detection substrate shown in FIG. 5.

The manufacturing method for a detection substrate shown in FIG. 5 is different from the manufacturing method for a detection substrate shown in FIG. 4 in that a UV adhesive is used to manufacture the reinforcement structure 8, manufacturing methods for remaining film layers are the same, and a schematic diagram of an attaching process of the support layer 1 shown in FIG. 5 is shown in FIG. 21.

Figure 22:
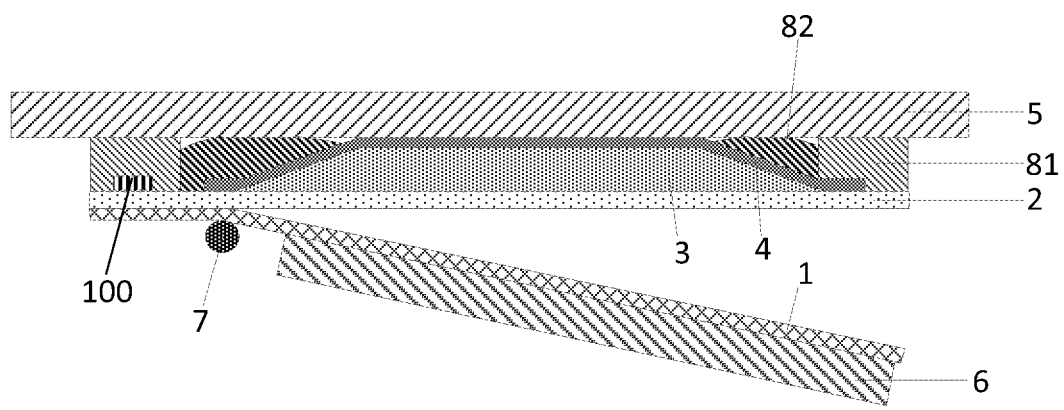
FIG. 22 is a schematic diagram illustrating a support layer in an attaching process in a detection substrate shown in FIG. 6.

The manufacturing method for a detection substrate shown in FIG. 6 is different from the manufacturing method for a detection substrate shown in FIG. 4 in that a tape adhesive is used to manufacture a first reinforcement structure 81, and then a UV adhesive is used to manufacture a second reinforcement structure 82, manufacturing methods for remaining film layers are the same, and a schematic diagram of an attaching process of the support layer 1 shown in FIG. 6 is shown in FIG. 22.

Figure 23:
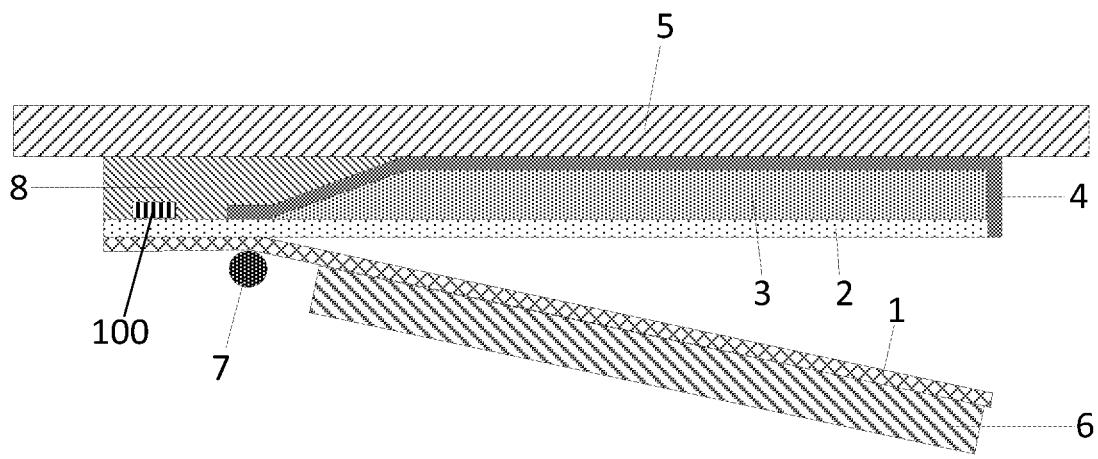
FIG. 23 is a schematic diagram illustrating a support layer in an attaching process in a detection substrate shown in FIG. 7.

The manufacturing method for a detection substrate shown in FIG. 7 is different from the manufacturing method for a detection substrate shown in FIG. 4 in that a structure forming the scintillator layer 3 is different, and it is necessary to remove the peripheral portion 32 in the non-bonding area when the scintillator layer 3 is formed in FIG. 7, the manufacturing methods for remaining film layers are the same, and a schematic diagram of an attaching process of the support layer 1 shown in FIG. 7 is shown in FIG. 23.

Figure 24:
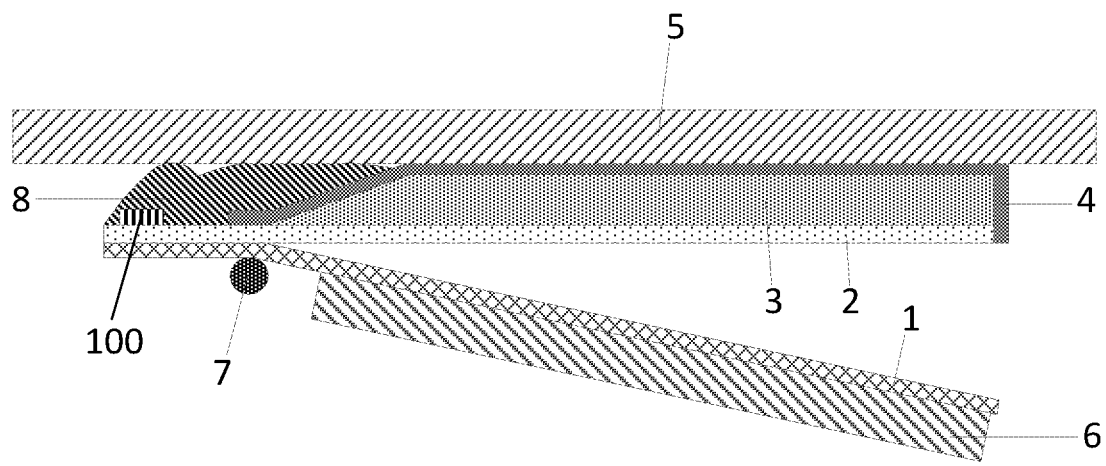
FIG. 24 is a schematic diagram illustrating a support layer in an attaching process in a detection substrate shown in FIG. 8.

The manufacturing method for a detection substrate shown in FIG. 8 is different from the manufacturing method for a detection substrate shown in FIG. 4 in that a structure forming the scintillator layer 3 is different, a material of the reinforcement structure 8 is different, it is necessary to remove the peripheral portion 32 in the non-bonding area when the scintillator layer 3 is formed in FIG. 8, and a UV adhesive is used to manufacture the reinforcement structure 8, the manufacturing methods for remaining film layers are the same, and a schematic diagram of an attaching process of the support layer 1 shown in FIG. 8 is shown in FIG. 24.

Figure 25:
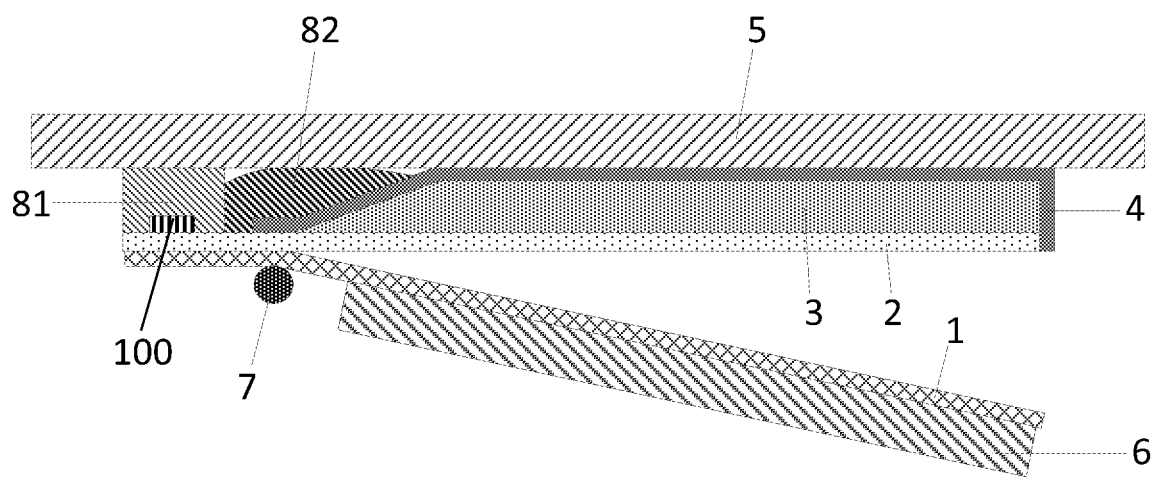
FIG. 25 is a schematic diagram illustrating a support layer in an attaching process in a detection substrate shown in FIG. 9.

The manufacturing method for a detection substrate shown in FIG. 9 is different from the manufacturing method for a detection substrate shown in FIG. 4 in that a structure forming the scintillator layer 3 is different, a material of the reinforcement structure 8 is different, it is necessary to remove the peripheral portion 32 in the non-bonding area when the scintillator layer 3 is formed in FIG. 9, and a tape adhesive is used to manufacture a first reinforcement structure 81, and then a UV adhesive is used to manufacture a second reinforcement structure 82, manufacturing methods for remaining film layers are the same, and a schematic diagram of an attaching process of the support layer 1 shown in FIG. 9 is shown in FIG. 25.

It should be noted that the manufacturing method for a detection substrate shown in FIGS. 12-17 is the same as the manufacturing method for a detection substrate shown in FIGS. 4-9, which is not repeated herein.

On the basis of the same inventive concept, embodiments of the disclosure further provides a manufacturing method for a detection substrate, which is used for manufacturing the detection substrate provided in embodiments of the disclosure and shown in FIG. 10. As shown in FIG. 26, the manufacturing method includes:

S2601, forming a scintillator film on a side of a flexible substrate, the scintillator film including a central portion and a peripheral portion located around the central portion, the central portion and the peripheral portion being of an integrated structure, the central portion having an approximately uniform thickness at each position, and in a direction from an edge of the flexible substrate to a center of the flexible substrate, a thickness of the peripheral portion progressively increases; and S2602, obtaining a scintillator layer having an approximately equal thickness at each position by removing the peripheral portion completely.

Specifically, the scintillator layer 3 including the central portion 31 and the peripheral portion 32 located around the central portion 31 is formed on the flexible substrate 2 by evaporation, and then the peripheral portion 32 is removed completely to obtain the scintillator layer 3 having an approximately equal thickness H1 at each position, which is shown in FIG. 10.

During a specific implementation, in the above manufacturing method provided in embodiments of the disclosure, as shown in FIG. 10, after the step of forming a scintillator layer 3, the manufacturing method further includes:

placing a side of the scintillator layer 3 on a base platform 5 of an attaching apparatus, in such a way that one side of the scintillator layer 3 is completely attached to the base platform 5; and attaching a support layer 1 to one side of the flexible substrate 2 facing away from the scintillator layer 3.

During a specific implementation, in the above manufacturing method provided in embodiments of the disclosure, as shown in FIG. 10, the attaching a support layer 1 to one side of the flexible substrate 2 facing away from the scintillator layer 3 may include:

placing the support layer on a support platform in the attaching apparatus, and attaching the support layer to one side of the flexible substrate facing away from the scintillator layer in a rolling manner.

During a specific implementation, in the above manufacturing method provided in embodiments of the disclosure, as shown in FIG. 10, after forming a scintillator layer and before placing one side of the scintillator layer on a base platform of an attaching apparatus, the manufacturing method further includes:

forming an encapsulation layer on a side of the scintillator layer facing away from the flexible substrate, the encapsulation layer completely covering the scintillator layer, an edge portion of the encapsulation layer making contact with the flexible substrate, and the encapsulation layer being configured according to a shape of the scintillator layer.

Specifically, as shown in FIG. 10, after forming a scintillator layer 3 and before placing one side of the scintillator layer 3 on a base platform 5 of an attaching apparatus, the manufacturing method further includes: forming an encapsulation layer 4 on one side of the scintillator layer 3 facing away from the flexible substrate 2, the encapsulation layer 4 completely covering the scintillator layer 3, an edge portion of the encapsulation layer 4 makes contact with the flexible substrate 2, and the encapsulation layer 4 being configured according to a shape of the scintillator layer 3.

The manufacturing method for a detection substrate provided in an embodiment of the disclosure and shown in FIG. 10 is described in detail below:

the manufacturing method for a detection substrate shown in FIG. 10 is different from the manufacturing method for a detection substrate shown in FIG. 4 in that a structure forming the scintillator layer 3 is different, it is unnecessary to form the reinforcement structure 8 in FIG. 10, and it is necessary to completely remove the peripheral portion when the scintillator layer 3 is formed in FIG. 10, the manufacturing methods for remaining film layers are the same, and a schematic diagram of an attaching process of the support layer 1 shown in FIG. 10 is shown in FIG. 27.

Figure 28:
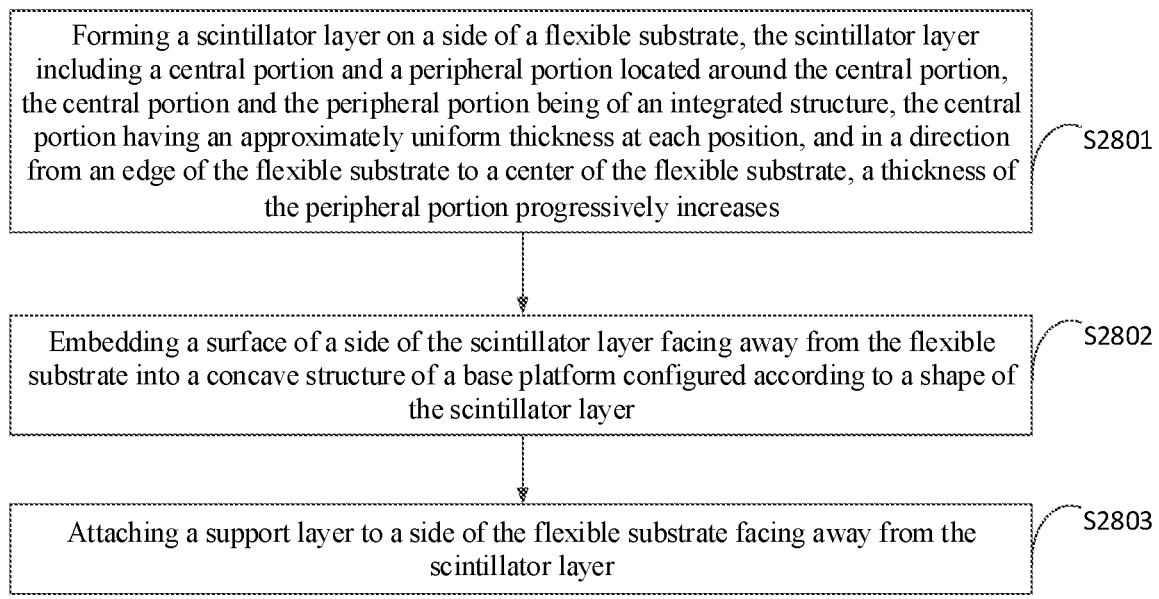
FIG. 28 is a schematic flowchart of a manufacturing method for yet another detection substrate provided in an embodiment of the disclosure.

On the basis of the same inventive concept, an embodiment of the disclosure further provides a manufacturing method for a detection substrate, which is used for manufacturing the detection substrate provided in embodiments of the disclosure and shown in FIG. 11A. As shown in FIG. 28, the manufacturing method includes:

S2801, forming a scintillator layer on a side of a flexible substrate, the scintillator layer including a central portion and a peripheral portion located around the central portion, the central portion and the peripheral portion being of an integrated structure, the central portion having an approximately uniform thickness at each position, and in a direction from an edge of the flexible substrate to a center of the flexible substrate, a thickness of the peripheral portion progressively increases:

S2802, embedding a surface of a side of the scintillator layer facing away from the flexible substrate into a concave structure of a base platform configured according to a shape of the scintillator layer; and S2803, attaching a support layer to a side of the flexible substrate facing away from the scintillator layer.

During a specific implementation, in the above manufacturing method provided in embodiments of the disclosure, attaching a support layer to one side of the flexible substrate facing away from the scintillator layer specifically includes:

placing the support layer on a support platform in the attaching apparatus, and attaching the support layer to one side of the flexible substrate facing away from the scintillator layer in a rolling manner.

During a specific implementation, in the above manufacturing method provided in embodiments of the disclosure, after the forming a scintillator layer and before the embedding a surface of one side of the scintillator layer facing away from the flexible substrate into a concave structure of a base platform, the manufacturing method further includes:

forming an encapsulation layer on a side of the scintillator layer facing away from the flexible substrate, the encapsulation layer completely covering the scintillator layer, an edge portion of the encapsulation layer making contact with the flexible substrate, and the encapsulation layer being configured according to a shape of the scintillator layer.

Specifically, as shown in FIG. 11A, after forming a scintillator layer 3 and before embedding a surface of one side of the scintillator layer 3 facing away from the flexible substrate 2 into a concave structure of a base platform 5, the manufacturing method further includes: forming an encapsulation layer 4 on the side of the scintillator layer 3 away from the flexible substrate 2, the encapsulation layer 4 completely covering the scintillator layer 3, an edge portion of the encapsulation layer 4 making contact with the flexible substrate 2, and the encapsulation layer 4 being configured according to a shape of the scintillator layer 3.

The manufacturing method for a detection substrate provided in embodiments of the disclosure and shown in FIG. 11A is described in detail as below:

The manufacturing method for a detection substrate shown in FIG. 11A is different from the manufacturing method for a detection substrate shown in FIG. 4 in that it is unnecessary to manufacture the reinforcement structure 8, a base platform 5 having a concave structure is used, the concave structure matches with one side of the encapsulation layer 4, manufacturing methods for remaining film layers are the same, and a schematic diagram of an attaching process of the support layer 1 shown in FIG. 11A is shown in FIG. 11B.

In view of the above, the manufacturing method for a detection substrate provided in embodiments of the disclosure may solve the problems of warp of the flexible substrate and the support layer and deformation of the scintillator layer, such that the problem of the defect in the bright image may be solved, and performance of the detection substrate may be improved.

Figure 29:
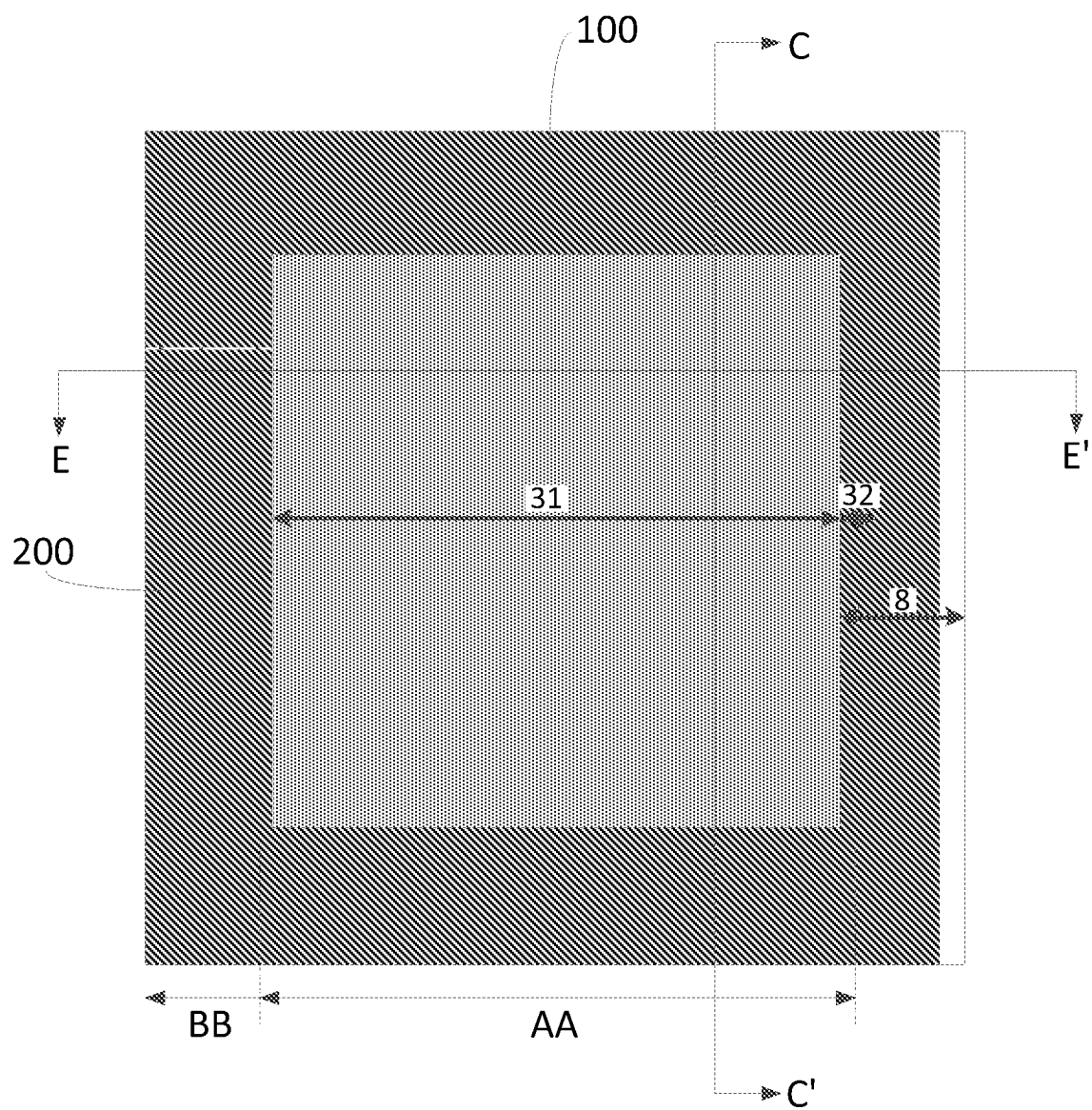
FIG. 29 is a schematic plan view of a detection substrate provided in an embodiment of the disclosure.

As shown in FIG. 29. FIG. 29 is a schematic plan view of a flat panel detector provided in an embodiment of the disclosure and shown in FIG. 18. The flat panel detector includes a photosensitive area AA and a peripheral area BB around the photosensitive area AA, where a central portion 31 located in the photosensitive area AA, part of a peripheral portion 32 is located in the in the photosensitive area AA, another part of the peripheral portion is located in the peripheral area BB, and the peripheral portion 32 is around the central portion 31. The peripheral area BB is further provided with Data COF 100 (that is, by bonding a pad on the flexible substrate 2 with a pad on the FPC, and for being connected with a read signal line RL of the photosensitive area AA), and Gate COF 200 (that is, by bonding the pad on the flexible substrate 2 with the pad on the FPC, and for being connected to a scan signal line SL of the photosensitive area AA); and the reinforcement structure 8 is a structure arranged after bonding. The reinforcement structure 8 is made of a tape adhesive, and an orthographic projection of the reinforcement structure 8 on the flexible substrate 2 covers an orthographic projection of the peripheral portion 32 on the flexible substrate 2 and covers the flexible substrate 2 on an outer side of the peripheral portion 32.

Figure 30:
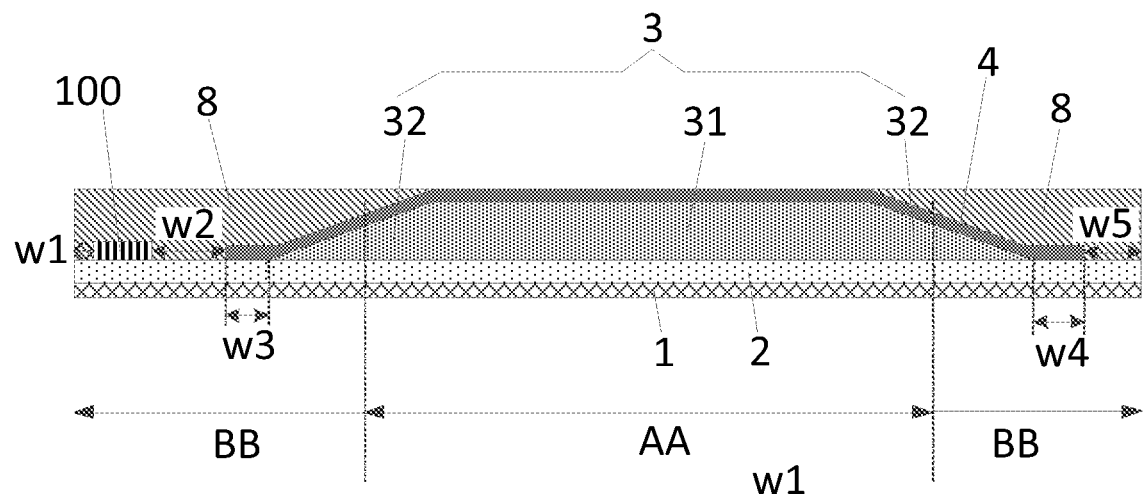
FIG. 30 is a schematic sectional view along a line CC' in FIG. 29.
Figure 31:
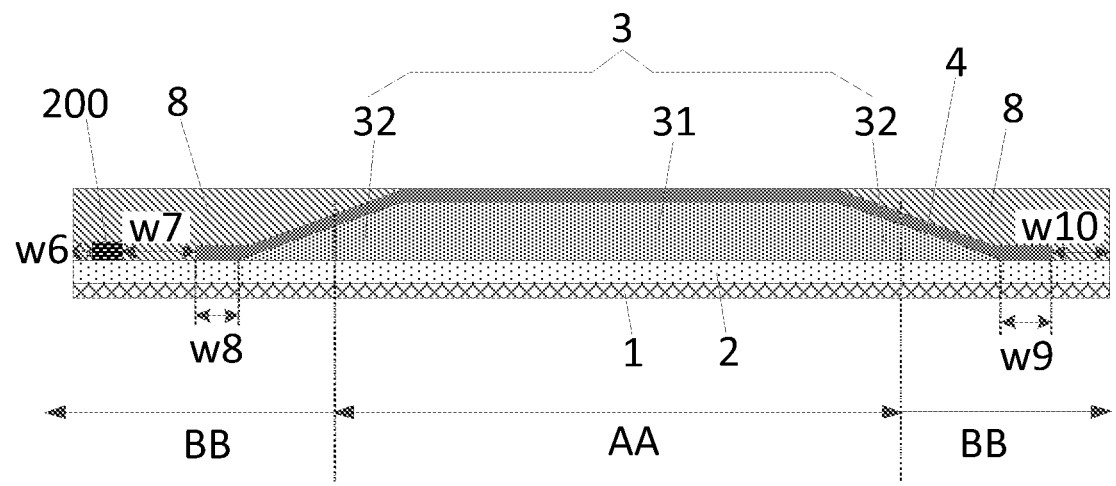
FIG. 31 is a schematic sectional view along a line EE' in FIG. 29.

As shown in FIGS. 30 and 31. FIG. 30 is a schematic sectional view along a line CC' in FIG. 29, and FIG. 31 is a schematic sectional view along a line EE' in FIG. 29. A size (the size of a flexible substrate 2) of a detection substrate shown in an embodiment of the disclosure takes 365 mm×443 mm as an example. As shown in FIG. 28, a width of Data COF 100 may be 1 mm to 4 mm, a distance w1 between the Data COF 100 and an edge of the flexible substrate 2 may be less than 0.8 mm, a distance w2 between the Data COF 100 and an encapsulation layer 4 may be 1 mm to 3 mm, and a distance w3 between an edge of a peripheral portion 32 and an edge of the encapsulation layer 4 may be 1 mm to 3 mm; and a distance w4 between an edge of the peripheral portion 32 and an edge of the encapsulation layer 4 on an opposite side of the Data COF 100 may be 1 mm to 5 mm, and a distance w5 between the edge of the encapsulation layer 4 and an edge of the flexible substrate 2 on the opposite side of the Data COF 100 may be 1 mm to 3 mm.

As shown in FIG. 31, the size of Gate COF 200 may be 1.5 mm to 2 mm, a distance w6 between the Gate COF 200 and the edge of flexible substrate 2 may be less than 0.8 mm, a distance w7 between the Gate COF 200 and the encapsulation layer 4 may be 1 mm to 3 mm, and a distance w8 between the edge of the peripheral portion 32 and the edge of the encapsulation layer 4 may be 1 mm to 3 mm: a distance w9 between an edge of the peripheral portion 32 and an edge of the encapsulation layer 4 on an opposite side of the Gate COF 200 may be 1 mm to 5 mm, and a distance w10 between an edge of the encapsulation layer 4 and an edge of the flexible substrate 2 on the opposite side of the Gate COF 200 may be 1 mm to 3 mm.

It should be noted that relevant parameters of FIGS. 29-31 are set only by the size of one detection substrate provided in embodiments of the disclosure, and certainly, the parameters may be set according to an actual size of the detection substrate.

On the basis of the same inventive concept, an embodiment of the disclosure further provides a flat panel detector. The flat panel detector includes the above detection substrate provided in embodiments of the disclosure. Since the principle of the flat panel detector to solve the problem is similar to the above one of the detection substrates, implementation of the flat panel detector may refer to the above detection substrate, which is not repeated.

Figure 32:
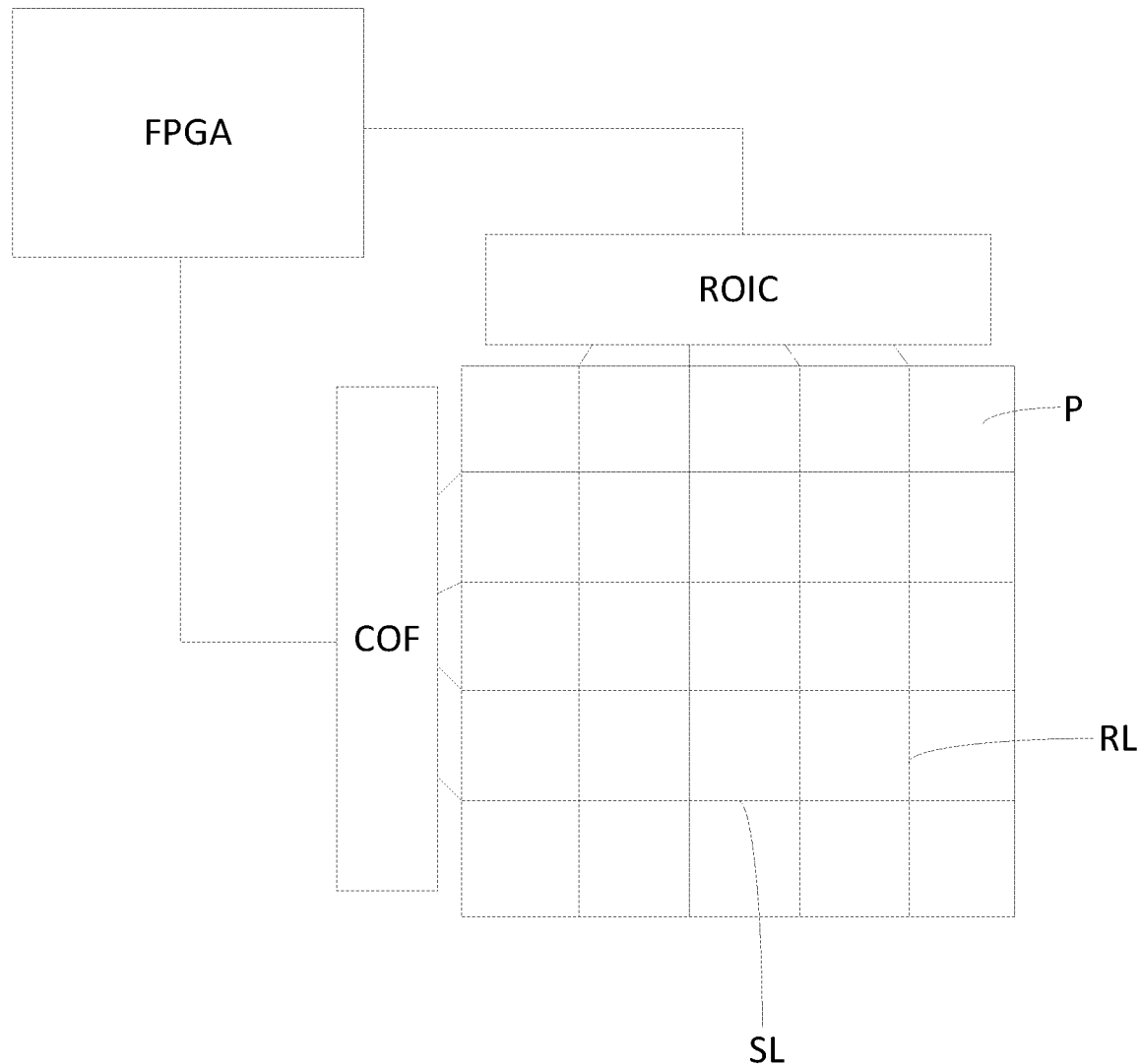
FIG. 32 is a schematic plan view of a flat panel detector provided in an embodiment of the disclosure.

Specifically, as shown in FIG. 32. FIG. 32 is a schematic plan view of a flat panel detector. Scan signal lines SL and read signal lines RL are crossed to define a plurality of detection pixel units P, and each detection pixel unit includes a transistor and a photoelectric conversion device, where drain electrodes of the same column of transistors are electrically connected with the same read signal line RL, gate electrodes of the same row of transistors are electrically connected with the same scan signal line SL, and a bias voltage line may extend in the same direction as the read signal line RL. The flat panel detector further includes a field-programmable gate array (FPGA) chip; and the scan signal line SL is connected with the FPGA chip by a COF; and the COF includes a date driver IC. The read signal line RL is connected with the FPGA chip by a signal readout IC.

The embodiments of the disclosure provide the detection substrate, the manufacturing method therefor and the flat panel detector. Since surfaces of the support layer and the flexible substrate making contact with each other are located in a flat plane, the support layer and the flexible substrate do not warp at the edges, such that the scintillator layer may not be raised in the attaching process of the support layer, that is, the edge area of the scintillator layer may not deform.

Therefore, the problem of warp of the support layer and the flexible substrate at the edge and deformation of the scintillator layer in the edge area may not occur in the detection substrate provided in the embodiments of the disclosure, such that the problem of the defect in the bright image may be solved, and performance of the detection substrate may be improved.

Although the preferred embodiments of the disclosure have been described, those skilled in the art can make additional changes and modifications to these embodiments once those skilled in the art learn the basic inventive concept. Therefore, the appended claims are intended to be interpreted as including the preferred embodiments and all the changes and modifications falling within the scope of the disclosure.

Apparently, those skilled in the art can make various modifications and variations to the embodiments of the disclosure without departing from the spirit and scope of the embodiments of the disclosure. In this way, if these modifications and variations of the embodiments of the disclosure fall within the scope of the claims of the disclosure and equivalent technologies of the claims, the disclosure is also intended to include these modifications and variations.

What is claimed is:

1. A detection substrate, comprising:
a flexible substrate;
a scintillator layer on a side of the flexible substrate, wherein the scintillator layer comprises a central portion and a peripheral portion on at least one side of the central portion, the central portion and the peripheral portion are of an integrated structure, a thickness of the central portion at each position is approximately equal, and in a direction from an edge of the flexible substrate to a center of the flexible substrate, a thickness of the peripheral portion progressively increases;
a reinforcement structure, wherein the reinforcement structure and the scintillator layer are disposed on a same side of the flexible substrate, and the reinforcement structure at least covers part of the peripheral portion; and
a support layer on a side of the flexible substrate facing away from the scintillator layer;
wherein the reinforcement structure is an integrated structure; and
a material of the reinforcement structure being the integrated structure comprises a tape adhesive or an ultraviolet (UV) adhesive.

2. The detection substrate according to claim 1, wherein a maximum thickness of the reinforcement structure is less than or equal to the thickness of the central portion and greater than or equal to 50% of the thickness of the central portion.

3. The detection substrate according to claim 1, wherein a maximum thickness of the reinforcement structure is approximately equal to the thickness of the central portion.

4. The detection substrate according to claim 1, wherein
a preset distance is provided between an edge of an orthographic projection of the peripheral portion on the flexible substrate close to an edge of the flexible substrate and the edge of the flexible substrate; and
the reinforcement structure covers at least part of an area of the flexible substrate that is not covered with the peripheral portion.

5. The detection substrate according to claim 1, wherein the flexible substrate comprises a photosensitive area and a peripheral area around the photosensitive area:
wherein the central portion is located in the photosensitive area, the peripheral portion is located completely or at least partially in the peripheral area, and the peripheral portion is arranged around the central portion.

6. The detection substrate according to claim 1, wherein the flexible substrate comprises a photosensitive area and a peripheral area around the photosensitive area:
wherein the peripheral area comprises a bonding area and a non-bonding area, and the peripheral portion is arranged on a side of the bonding area.

7. A detection substrate, comprising:
a flexible substrate;
a scintillator layer on a side of the flexible substrate, wherein the scintillator layer comprises a central portion and a peripheral portion on at least one side of the central portion, the central portion and the peripheral portion are of an integrated structure, a thickness of the central portion at each position is approximately equal, and in a direction from an edge of the flexible substrate to a center of the flexible substrate, a thickness of the peripheral portion progressively increases;
a reinforcement structure, wherein the reinforcement structure and the scintillator layer are disposed on a same side of the flexible substrate, and the reinforcement structure at least covers part of the peripheral portion; and
a support layer on a side of the flexible substrate facing away from the scintillator layer;
wherein the reinforcement structure comprises:
a first reinforcement structure at a side of the peripheral portion away from the central portion; and
a second reinforcement structure between the first reinforcement structure and the peripheral portion;
wherein the first reinforcement structure is in contact with the second reinforcement structure; and
a material of the first reinforcement structure comprises a tape adhesive, and a material of the second reinforcement structure comprises a UV adhesive.

8. The detection substrate according to claim 1, further comprising:
an encapsulation layer between the scintillator layer and the reinforcement structure;
wherein the encapsulation layer completely covers the scintillator layer, an edge portion of the encapsulation layer makes contact with the flexible substrate, and the encapsulation layer is configured according to a shape of the scintillator layer.

9. The detection substrate according to claim 1, further comprising:

a transistor between the flexible substrate and the scintillator layer:
a photoelectric conversion device between the transistor and the scintillator layer; and
a bias voltage line between the photoelectric conversion device and the scintillator layer;
wherein a bottom electrode of the photoelectric conversion device is electrically connected with the transistor, and the bias voltage line is electrically connected with a top electrode of the photoelectric conversion device.

10. A manufacturing method for the detection substrate of claim 7, comprising:
forming the scintillator layer on the side of a flexible substrate, wherein the scintillator layer comprises the central portion and the peripheral portion on at least one side of the central portion, the central portion and the peripheral portion are of an integrated structure, the thickness of the central portion at each position is approximately equal, and in the direction from the edge of the flexible substrate to the center of the flexible substrate, the thickness of the peripheral portion progressively increases;
forming a reinforcement structure on the side of the flexible substrate, wherein the reinforcement structure and the scintillator layer are disposed on the same side of the flexible substrate, and the reinforcement structure at least covers part of the peripheral portion;
embedding a surface of the scintillator layer facing away from the flexible substrate into a concave structure of a base platform of an attaching apparatus, wherein the concave structure is configured according to a shape of the scintillator layer; and
attaching a support layer to a side of the flexible substrate facing away from the scintillator layer.

11. A manufacturing method for the detection substrate of claim 1 comprising:
forming the scintillator layer on the side of a flexible substrate, wherein the scintillator layer comprises the central portion and the peripheral portion on at least one side of the central portion, the central portion and the peripheral portion are of an integrated structure, the thickness of the central portion at each position is approximately equal, and in the direction from the edge of the flexible substrate to the center of the flexible substrate, the thickness of the peripheral portion progressively increases;
forming a reinforcement structure on the side of the flexible substrate, wherein the reinforcement structure and the scintillator layer are disposed on the same side of the flexible substrate, and the reinforcement structure at least covers part of the peripheral portion;
embedding a surface of the scintillator layer facing away from the flexible substrate into a concave structure of a base platform of an attaching apparatus, wherein the concave structure is configured according to a shape of the scintillator layer; and
attaching a support layer to a side of the flexible substrate facing away from the scintillator layer.

12. The manufacturing method according to claim 11, wherein the flexible substrate comprises a bonding area and a non-bonding area, and the forming the scintillator layer on the side of the flexible substrate further comprises:
removing the peripheral portion on the side of the non-bonding area of the flexible substrate; and
obtaining the scintillator layer comprising the central portion and the peripheral portion located on the side of the bonding area of the flexible substrate.

13. The manufacturing method according to claim 11, wherein after the forming a reinforcement structure, the manufacturing method further comprises:
placing a side of the scintillator layer on a base platform of an attaching apparatus in such a way that the side of the scintillator layer is completely attached to the base platform; and
attaching a support layer to the side of the flexible substrate facing away from the scintillator layer.

14. The manufacturing method according to claim 11, wherein the attaching the support layer to the side of the flexible substrate facing away from the scintillator layer comprises:
placing the support layer on a support platform in the attaching apparatus; and
attaching the support layer to the side of the flexible substrate facing away from the scintillator layer in a rolling manner.

15. The manufacturing method according to claim 11, wherein after forming the scintillator layer and before forming the reinforcement structure, the manufacturing method further comprises:
forming an encapsulation layer on the side of the scintillator layer facing away from the flexible substrate;
wherein the encapsulation layer completely covers the scintillator layer, an edge portion of the encapsulation layer makes contact with the flexible substrate, and the encapsulation layer is configured according to a shape of the scintillator layer.

* * * * *